(12) United States Patent
Valentine

(10) Patent No.: US 11,355,480 B1
(45) Date of Patent: Jun. 7, 2022

(54) MICROPIXELLATION FOR ALIGNMENT-FREE ASSEMBLY

(71) Applicant: Facebook Technologies, LLC, Menlo Park, CA (US)

(72) Inventor: Gareth Valentine, Redmond, WA (US)

(73) Assignee: FACEBOOK TECHNOLOGIES, LLC, Menlo Park, CA (US)

(*) Notice: Subject to any disclaimer, the term of this patent is extended or adjusted under 35 U.S.C. 154(b) by 38 days.

(21) Appl. No.: 16/773,355

(22) Filed: Jan. 27, 2020

(51) Int. Cl.
| H01L 25/075 | (2006.01) |
| H01L 33/00 | (2010.01) |
| H01L 33/58 | (2010.01) |
| H01L 33/62 | (2010.01) |

(52) U.S. Cl.
CPC ........ H01L 25/0753 (2013.01); H01L 33/005 (2013.01); H01L 33/58 (2013.01); H01L 33/62 (2013.01)

(58) Field of Classification Search
CPC ... H01L 25/0753; H01L 33/62; H01L 33/005; H01L 33/58
See application file for complete search history.

(56) References Cited

U.S. PATENT DOCUMENTS

| 8,987,765 | B2* | 3/2015 | Bibl | H01L 33/60 257/98 |
| 9,847,047 | B2* | 12/2017 | Wu | G09G 3/006 |
| 10,211,371 | B2 | 2/2019 | Bonar et al. | |
| 10,325,894 | B1* | 6/2019 | Pan | H01L 27/156 |
| 10,629,577 | B2* | 4/2020 | Tao | H01L 25/18 |
| 10,847,083 | B1* | 11/2020 | Pan | H01L 27/15 |
| 2017/0213502 | A1* | 7/2017 | Henry | H01L 25/167 |
| 2017/0294479 | A1* | 10/2017 | Cha | H01L 33/507 |
| 2019/0302917 | A1* | 10/2019 | Pan | G06F 3/044 |
| 2019/0333442 | A1* | 10/2019 | Pan | H01L 27/15 |
| 2020/0066787 | A1* | 2/2020 | Park | H01L 27/156 |
| 2021/0074761 | A1* | 3/2021 | Li | H01L 27/15 |
| 2021/0111302 | A1* | 4/2021 | Pan | H01L 25/0753 |
| 2021/0159376 | A1* | 5/2021 | Hurni | H01L 27/153 |
| 2021/0193730 | A1* | 6/2021 | Armitage | H01L 33/24 |
| 2021/0242354 | A1* | 8/2021 | Wang | H01L 31/0352 |
| 2021/0288220 | A1* | 9/2021 | Oh | H01L 27/156 |

* cited by examiner

Primary Examiner — Victor A Mandala
(74) Attorney, Agent, or Firm — Weaver Austin Villeneuve & Sampson LLP

(57) ABSTRACT

Disclosed herein is an apparatus for providing conductivity. The apparatus may include an epitaxial layered structure having a first-type doped semiconductor layer, a second-type doped semiconductor layer, and an active layer between the first-type doped semiconductor layer and the second-type doped semiconductor layer. The apparatus may also include a conductive layer adjacent to and in ohmic contact with the first-type doped semiconductor layer. The conductive layer may have a micropixellated structure comprising a plurality of micropixel contact areas that are electrically isolated from each other. The plurality of micropixel contact areas may be sized and spaced to allow multiple ones of the plurality of micropixel contact areas to overlap a single contact pad for providing charge flow for a pixel in an array of pixels formed using the epitaxial layered structure.

14 Claims, 14 Drawing Sheets

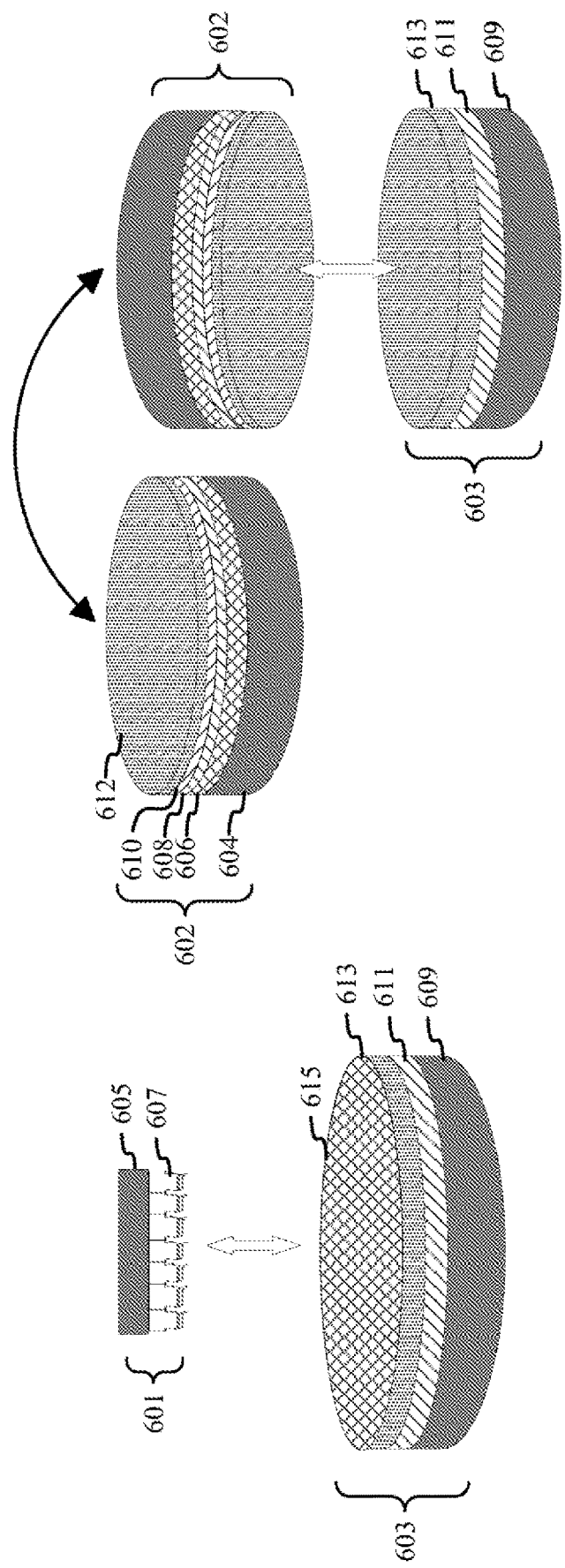

MICROPIXELLATION FOR ALIGNMENT-FREE ASSEMBLY

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. As LEDs become smaller in size, manufacturing and connection of such devices become ever more challenging. One such challenge is bonding of an LED array to a back component, such as a backplane or driver chip. During bonding of the LED array to the back component, precise alignment between the contacts of the LEDs in the LED array and features on the back component is often required. Any misalignment or errors during bonding may lower the overall yield of the LED array or form a nonfunctional LED device. Moreover, the precise alignment requirements of bonding often require costly equipment or labor to ensure that adequate alignment. These alignment issues are becoming exacerbated as LEDs become smaller. Accordingly, there is a need for improved alignment.

SUMMARY

This disclosure relates generally to micro light emitting diodes (micro-LEDs). More specifically, this disclosure relates to micro-LEDs having a micropixellated structure. According to certain embodiments, an apparatus for producing conductivity may be provided. The apparatus for producing conductivity may include an epitaxial layered structure. The epitaxial layered structure may include a first-type doped semiconductor layer and a second-type doped semiconductor layer. In some embodiments, the first-type doped semiconductor layer may include a p-type doped semiconductor layer and the second-type doped semiconductor layer may include an n-type doped semiconductor layer. An active layer may be between the first-type doped semiconductor layer and the second-type doped semiconductor layer.

The apparatus for providing conductivity may also include a conductive layer adjacent to and in ohmic contact with the first-type doped semiconductor layer. The conductive layer may have a micropixellated structure. The micropixellated structure may include a plurality of micropixel contact areas that are electrically isolated from each other. The plurality of micropixel contact areas may be sized and spaced to allow multiple ones of the plurality of micropixel contact areas to overlap a single contact pad for providing charge flow for a pixel in an array of pixels formed using the epitaxial layered structure.

In some embodiments, the micropixellated structure may include a closely-packed hexagonal pattern of the plurality of micropixel contact areas. In other embodiments, the micropixellated structure may include a square pattern of the plurality of micropixel contact areas. Optionally, the micropixellated structure may further include a plurality of micropixel regions in the first-type doped semiconductor layer. In some instances, the plurality of micropixel regions may be isolated from one another by a physical etch. In some embodiments, the plurality of micropixel regions are electrically isolated from one another by an upper layer of the first-type doped semiconductor layer, within the first-type doped semiconductor layer, having reduced conductivity.

Optionally, the upper layer of the first-type doped semiconductor layer having reduced conductivity may be formed by plasma treatment. In some embodiments, the upper layer of the first-type doped semiconductor layer having reduced conductivity may be formed by ion implantation. In other embodiments, the upper layer of the first type doped semiconductor layer may have reduced conductivity may be formed by ion diffusion. In some embodiments, the apparatus may include a light extraction feature. The light extraction feature may be positioned to collate light emitted from a plurality of micropixels corresponding to the plurality of micropixel contact areas.

In some embodiments, the micropixellated structure may form a strip including the plurality of micropixel contact areas and a common second-type contact area corresponding to the plurality of micropixel contact areas. In such embodiments, the apparatus may include a plurality of strips. The plurality of strips may include a first strip, a second strip, and a third strip. The first strip may correspond to a red color emission and may comprise a first common contact in a first position. The second strip may correspond to a blue color emission and may comprise a second common contact in a second position. The third strip may correspond to a green color emission and may comprise a third common contact in a third position. Each of the first common contact, the second common contact, and the third common contact may be sized and spaced to allow overlap of the first common contact with a first contact pad, the second common contact with a second contact pad, and the third common contact with a third contact pad for providing charge flow for a pixel in an array of pixels formed using the plurality of strips.

According to certain embodiments, a fabrication process for electronic components is disclosed herein. The fabrication process for electronic components may include providing an epitaxial layered structure. The epitaxial layered structure may include a first-type doped semiconductor layer, a second-type doped semiconductor layer, and an active layer between the first-type doped semiconductor layer and the second-type doped semiconductor layer. The fabrication process may also include depositing a conductive layer adjacent to the first-type doped semiconductor to form ohmic contact between the conductive layer and the first-type doped semiconductor layer. The fabrication process may also include forming a patterned mask layer on the conductive layer. The patterned mask layer may protect at least part of the conductive layer and may expose one or more unprotected mask regions. The fabrication process may also include processing the one or more unprotected mask regions to form a micropixellated structure comprising a plurality of micropixel contact areas electrically isolated from each other. The plurality of micropixel contact areas may be sized and spaced to allow multiple ones of the plurality of micropixel contact areas to overlap a single contact pad for providing charge flow for a pixel in an array of pixels formed using the epitaxial layered structure.

In some embodiments, the micropixellated structure may further include a plurality of micropixel regions in the first-type doped semiconductor layer. In some instances, the fabrication process may further include physically etching the first-type doped semiconductor layer to electrically isolate the plurality of micropixel regions from one another. Optionally, the plurality of micropixel regions may be electrically isolated from one another by an upper layer of first-type doped semiconductor layer, within the first-type doped semiconductor layer, having reduced conductivity. In some cases, the upper layer of the first-type doped semiconductor layer having reduced conductivity may be formed by subjecting the upper layer of first-type doped semiconductor layer to plasma treatment. In other cases, the upper layer of first-type doped semiconductor layer having reduced conductivity may be formed by subjecting the upper layer of first-type doped semiconductor layer to ion implantation.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 6A illustrates an example of a method of die-to-wafer bonding for arrays of LEDs according to certain embodiments.

FIG. 6B illustrates an example of a method of wafer-to-wafer bonding for arrays of LEDs according to certain embodiments.

Figure 1:
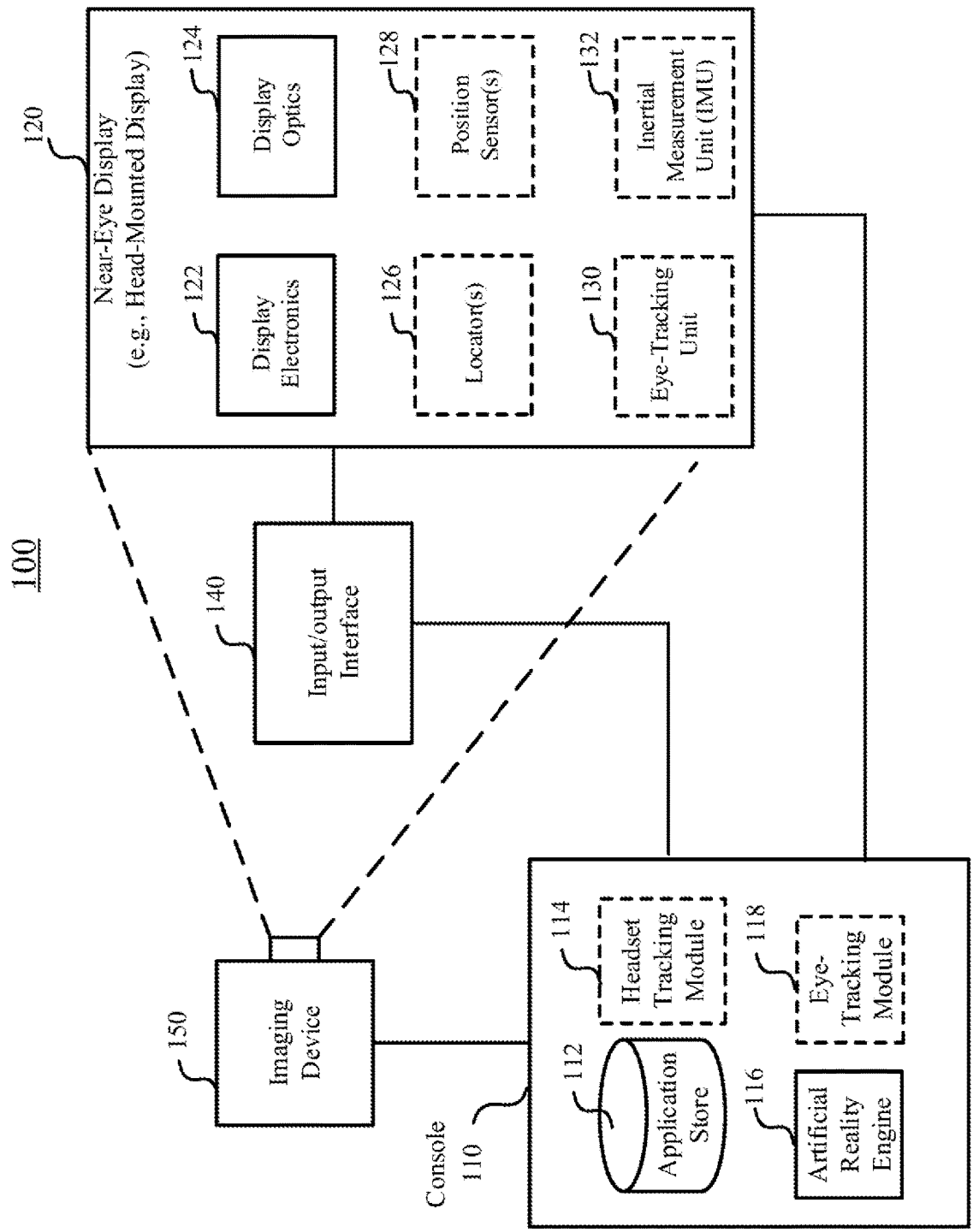
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, this disclosure relates to micro-LEDs ("µLEDs") and bonding techniques for fabricating micro-LED devices. Disclosed herein are micropixellated structures and techniques for forming micropixellated structures that allow for relaxed or alignment-free bonding of micro-LED arrays to a back component (i.e., a backplane or driver). Various inventive embodiments are described herein, including devices, systems, methods, materials, and the like.

During conventional fabrication processes of micro-LED devices, one or more micro-LEDs arrays may be bonded to a back component. For example, an array of micro-LEDs may be bonded to a backplane that facilitates connection to a fine pitch of a micro-LED array (e.g., by fanning out connections) and power the micro-LED array. In other examples, an array of micro-LEDs may be bonded to a fully customized drive integrated circuit (IC) or a thin-film transistor based drive device. Regardless of the type of back component to which the micro-LED array is bonded, conventional methods of bonding typically require a high degree of precision. During the bonding process, a wafer or diced portions of a wafer having the fabricated micro-LED structures thereon may require alignment with corresponding features on the back component (i.e., backplane or driver). Alignment of the micro-LED structures with the corresponding features on the back component may be necessary to ensure electrical contact between the micro-LEDs and the features of the back component. Any misalignment may result in lack of electrical contact between the micro-LEDs and back component which may cause for fewer micro-LEDs to be activated. This may lead to reduced light emission from the micro-LED array. In other words, under conventional bonding techniques and micro-LED arrays, without proper alignment, current may not flow from through the micro-LEDs, and the micro-LEDs may not function properly.

The micropixellated structures and related fabrication methods described herein may allow for flexible alignment, and even alignment-free, bonding of micro-LED arrays with a back component. As described herein, a micro-LED array may have a micropixellated structure forming a plurality of micro-LEDs. Each of the micro-LEDs may have a micropixel contact area that is electrically isolated from any adjacent micropixel contact area. The micropixel contact areas may be formed on the same plane and sized and shaped such to allow multiple ones of the plurality of micropixel contact areas to overlay and contact a common contact layer, such as a common electrode. By forming a plurality of micropixel contact areas in the same plane that are electrically isolated from one another, a micro-LED array may be bonded directly to a backplane or driver chip at wafer scale without necessitating any precision alignment. By sizing and spacing the micro-LEDs formed by the micropixellated structure, a portion of the micro-LEDs within the micro-LED array may overlap and contact a common electrode on the back component, thereby being activated. The micropixellated structure may allow electrically insulating regions to be formed between desired active pixels, thus preventing an electrical short circuit between adjacent pixels. Accordingly, the micropixellated structures may allow for fabrication of micro-LED devices with simplified high resolution bonding to a backplane or driver without require a high precision of alignment.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs) each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
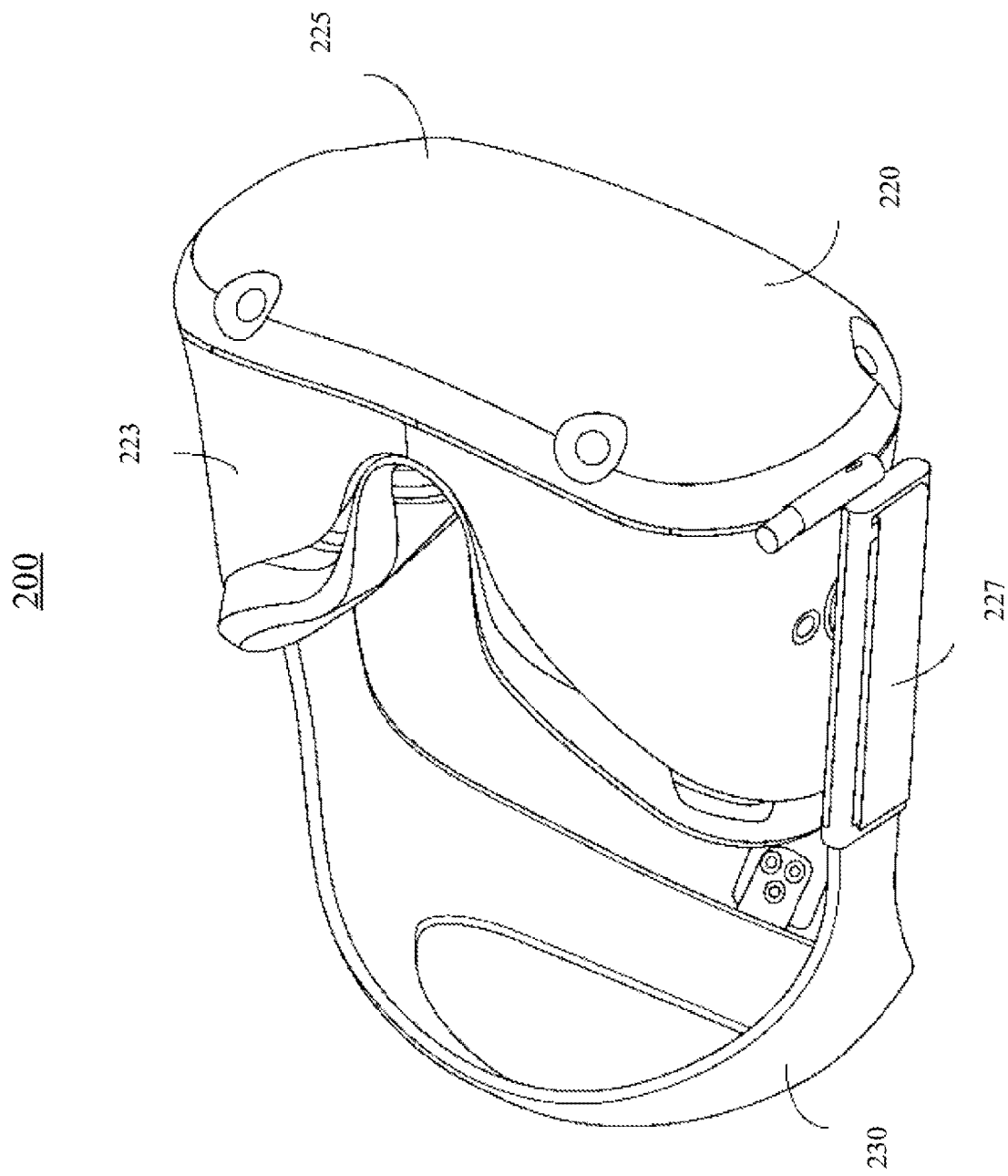
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
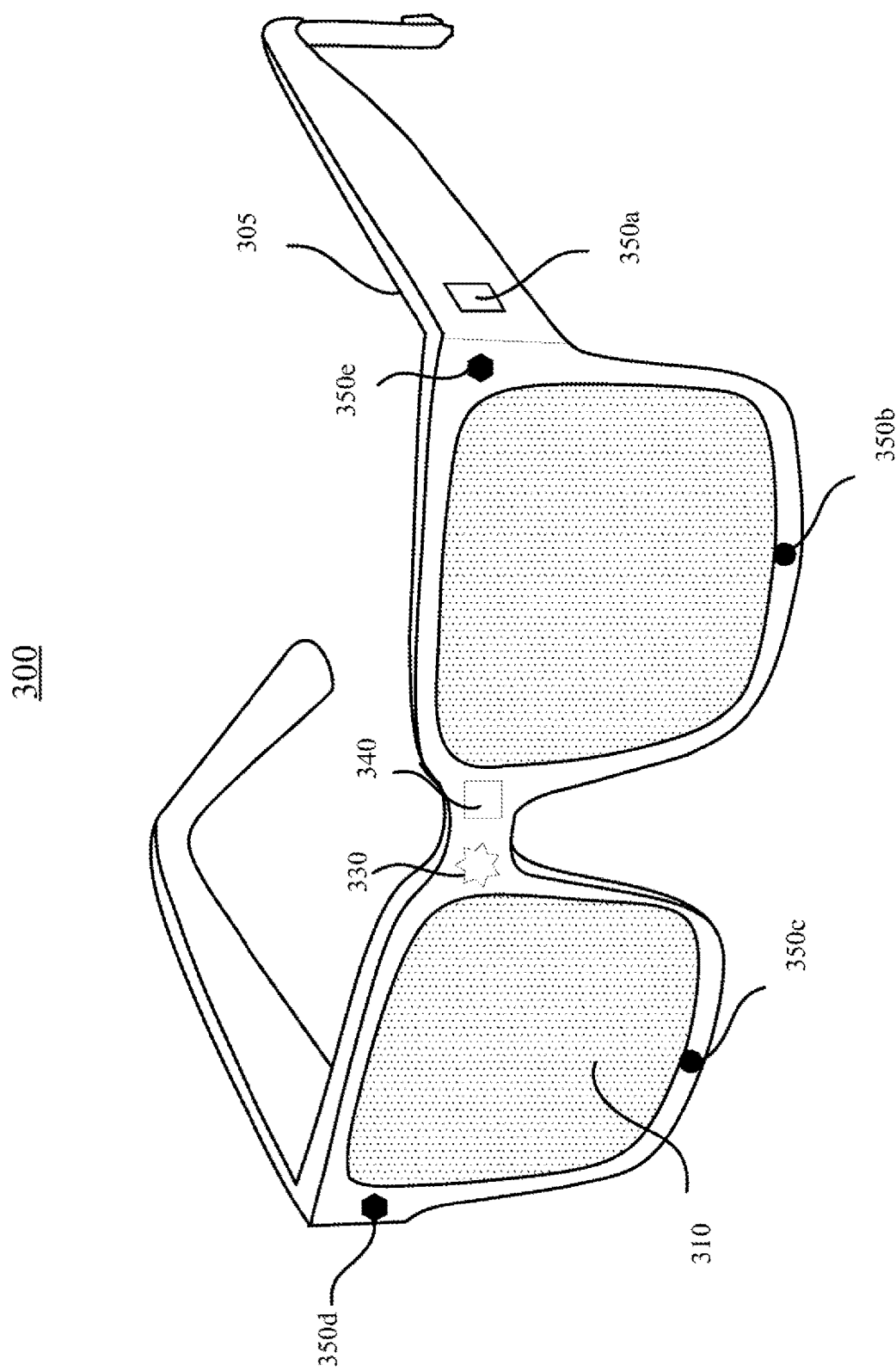
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

MicroLEDs ("μLEDs") based on III-nitride semiconductors and quaternary phosphide compositions, such as alloys of AlN, GaN, InN, AlGaInP and the like, have begun to be developed for various display applications due to their small size (e.g., with a linear dimension less than 100 μm, less than 50 μm, less than 10 μm, or less than 5 μm), high packing density (and hence higher resolution), and high brightness. For example, micro-LEDs that emit light of different colors (e.g., red, green, and blue) can be used to form the sub-pixels of a display system, such as a near-eye display system. In exemplary cases, red microLEDs may be based on AlGaInP quantum wells grown on semiconductor layers containing one or more of AlGaAs, GaAs, or a InGaN variant.

The light sources or displays described above may include one or more light emitting diodes (LEDs) or micro-LED. For example, each pixel in a display may include three subpixels that include a red micro-LED, a green-micro LED, and a blue micro-LED. In some embodiments, an infra-red micro-LED may also be included, for a total of four subpixels. In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 4A:
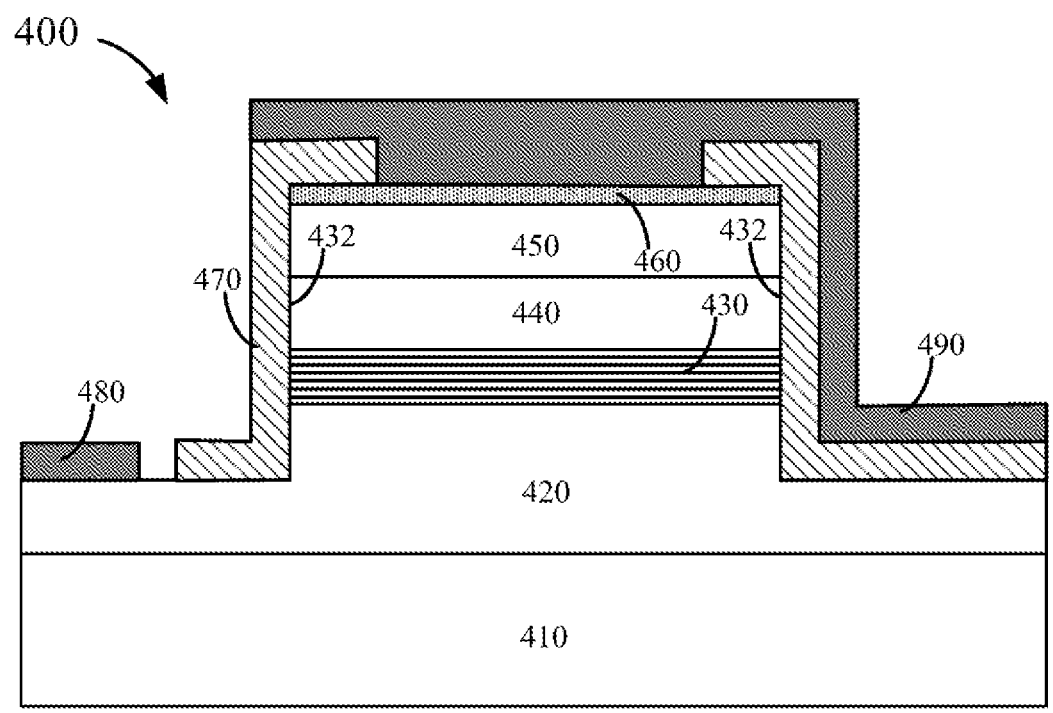
FIG. 4A illustrates an example of a light emitting diode (LED) having a vertical mesa structure according to certain embodiments.

FIG. 4A illustrates an example of an LED 400 having a vertical mesa structure. LED 400 may be a light emitter in light source. LED 400 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 4A, LED 400 may include a substrate 410, which may include, for example, a sapphire substrate or a GaN substrate. A semiconductor layer 420 may be grown on substrate 410. Semiconductor layer 420 may include a III-V material, such as GaN, and may be p-doped (e.g., with Mg, Ca, Zn, or Be) or n-doped (e.g., with Si or Ge). One or more active layers 430 may be grown on semiconductor layer 420 to form an active region. Active layer 430 may include III-V materials, such as one or more InGaN layers, one or more AlInGaP layers, and/or one or more GaN layers, which may form one or more heterostructures, such as one or more quantum wells or MQWs. A semiconductor layer 440 may be grown on active layer 430. Semiconductor layer 440 may include a III-V material, such as GaN, and may be p-doped (e.g., with Mg, Ca, Zn, or Be) or n-doped (e.g., with Si or Ge). One of semiconductor layer 420 and semiconductor layer 440 may be a p-type layer and the other one may be an n-type layer. Semiconductor layer 420 and semiconductor layer 440 sandwich active layer 430 to form the light emitting region. For example, LED 400 may include a layer of InGaN situated between a layer of p-type GaN doped with magnesium and a layer of n-type GaN doped with silicon or oxygen. In some embodiments, LED 400 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 4A) may be grown to form a layer between active layer 430 and at least one of semiconductor layer 420 or semiconductor layer 440. The EBL may reduce the electron leakage current and improve the efficiency of the LED. In some embodiments, a heavily-doped semiconductor layer 450, such as a $P^+$ or $P^{++}$ semiconductor layer, may be formed on semiconductor layer 440 and act as a contact layer for forming an ohmic contact and reducing the contact impedance of the device. In some embodiments, a conductive layer 460 may be formed on heavily-doped semiconductor layer 450. Conductive layer 460 may include, for example, an indium tin oxide (ITO) or Al/Ni/Au film. In one example, conductive layer 460 may include a transparent ITO layer.

To make contact with semiconductor layer 420 (e.g., an n-GaN layer) and to more efficiently extract light emitted by active layer 430 from LED 400, the semiconductor material layers (including heavily-doped semiconductor layer 450, semiconductor layer 440, active layer 430, and semiconductor layer 420) may be etched to expose semiconductor layer 420 and to form a mesa structure that includes layers 420-460. The mesa structure may confine the carriers within the device. Etching the mesa structure may lead to the formation of mesa sidewalls 432 that may be orthogonal to the growth planes. A passivation layer 470 may be formed on sidewalls 432 of the mesa structure. Passivation layer 470 may include an oxide layer, such as a $SiO_2$ layer, and may act as a reflector to reflect emitted light out of LED 400. A contact layer 480, which may include a metal layer, such as Al, Au, Ni, Ti, or any combination thereof, may be formed on semiconductor layer 420 and may act as an electrode of LED 400. In addition, another contact layer 490, such as an Al/Ni/Au metal layer, may be formed on conductive layer 460 and may act as another electrode of LED 400.

When a voltage signal is applied to contact layers 480 and 490, electrons and holes may recombine in active layer 430, where the recombination of electrons and holes may cause photon emission. The wavelength and energy of the emitted photons may depend on the energy bandgap between the valence band and the conduction band in active layer 430. For example, InGaN active layers may emit green or blue light, AlGaN active layers may emit blue to ultraviolet light, while AlInGaP active layers may emit red, orange, yellow, or green light. The emitted photons may be reflected by passivation layer 470 and may exit LED 400 from the top (e.g., conductive layer 460 and contact layer 490) or bottom (e.g., substrate 410).

In some embodiments, LED 400 may include one or more other components, such as a lens, on the light emission surface, such as substrate 410, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 4B:
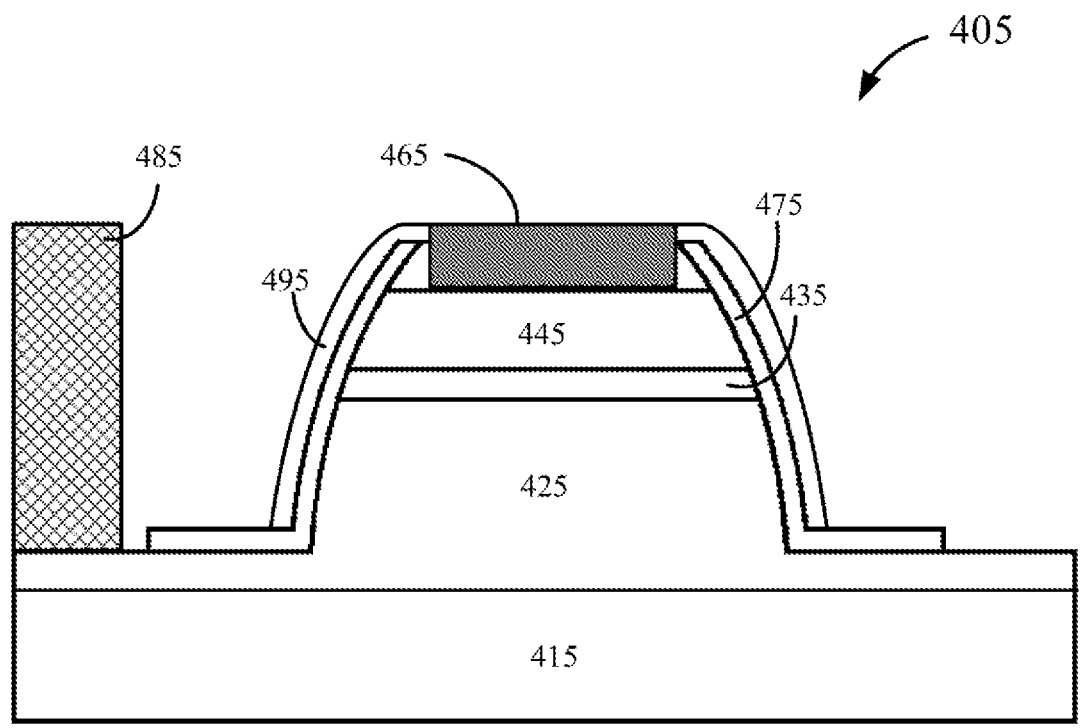
FIG. 4B is a cross-sectional view of an example of an LED having a parabolic mesa structure according to certain embodiments.

FIG. 4B is a cross-sectional view of an example of an LED 405 having a parabolic mesa structure. Similar to LED 400, LED 405 may include multiple layers of semiconductor materials, such as multiple layers of III-V semiconductor materials. The semiconductor material layers may be epitaxially grown on a substrate 415, such as a GaN substrate or a sapphire substrate. For example, a semiconductor layer 425 may be grown on substrate 415.

Semiconductor layer 425 may include a III-V material, such as GaN, and may be p-doped (e.g., with Mg, Ca, Zn, or Be) or n-doped (e.g., with Si or Ge). One or more active layer 435 may be grown on semiconductor layer 425. Active layer 435 may include III-V materials, such as one or more InGaN layers, one or more AlInGaP layers, and/or one or more GaN layers, which may form one or more heterostructures, such as one or more quantum wells. A semiconductor layer 445 may be grown on active layer 435. Semiconductor layer 445 may include a III-V material, such as GaN, and may be p-doped (e.g., with Mg, Ca, Zn, or Be) or n-doped (e.g., with Si or Ge). One of semiconductor layer 425 and semiconductor layer 445 may be a p-type layer and the other one may be an n-type layer.

To make contact with semiconductor layer 425 (e.g., an n-type GaN layer) and to more efficiently extract light emitted by active layer 435 from LED 405, the semiconductor layers may be etched to expose semiconductor layer 425 and to form a mesa structure that includes layers 425-445. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 425-445.

As shown in FIG. 4B, LED 405 may have a mesa structure that includes a flat top. A dielectric layer 475 (e.g., $SiO_2$ or SiNx) may be formed on the facets of the mesa structure. In some embodiments, dielectric layer 475 may include multiple layers of dielectric materials. In some embodiments, a metal layer 495 may be formed on dielectric layer 475. Metal layer 495 may include one or more metal or metal alloy materials, such as aluminum (Al), silver (Ag), gold (Au), platinum (Pt), titanium (Ti), copper (Cu), or any combination thereof. Dielectric layer 475 and metal layer 495 may form a mesa reflector that can reflect light emitted by active layer 435 toward substrate 415. In some embodiments, the mesa reflector may be parabolic-shaped to act as a parabolic reflector that may at least partially collimate the emitted light.

Electrical contact 465 and electrical contact 485 may be formed on semiconductor layer 445 and semiconductor layer 425, respectively, to act as electrodes. Electrical contact 465 and electrical contact 485 may each include a conductive material, such as Al, Au, Pt, Ag, Ni, Ti, Cu, or any combination thereof (e.g., Ag/Pt/Au or Al/Ni/Au), and may act as the electrodes of LED 405. In the example shown in FIG. 4B, electrical contact 485 may be an n-contact, and electrical contact 465 may be a p-contact. Electrical contact 465 and semiconductor layer 445 (e.g., a p-type semiconductor layer) may form a back reflector for reflecting light emitted by active layer 435 back toward substrate 415. In some embodiments, electrical contact 465 and metal layer 495 include same material(s) and can be formed using the same processes. In some embodiments, an additional conductive layer (not shown) may be included as an intermediate conductive layer between the electrical contacts 465 and 485 and the semiconductor layers.

When a voltage signal is applied across contacts 465 and 485, electrons and holes may recombine in active layer 435. The recombination of electrons and holes may cause photon emission, thus producing light. The wavelength and energy of the emitted photons may depend on the energy bandgap between the valence band and the conduction band in active layer 435. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 405, for example, from the bottom side (e.g., substrate 415) shown in FIG. 4B. One or more other secondary optical components, such as a lens or a grating, may be formed on the light emission surface, such as substrate 415, to focus or collimate the emitted light and/or couple the emitted light into a waveguide.

Figure 5A:
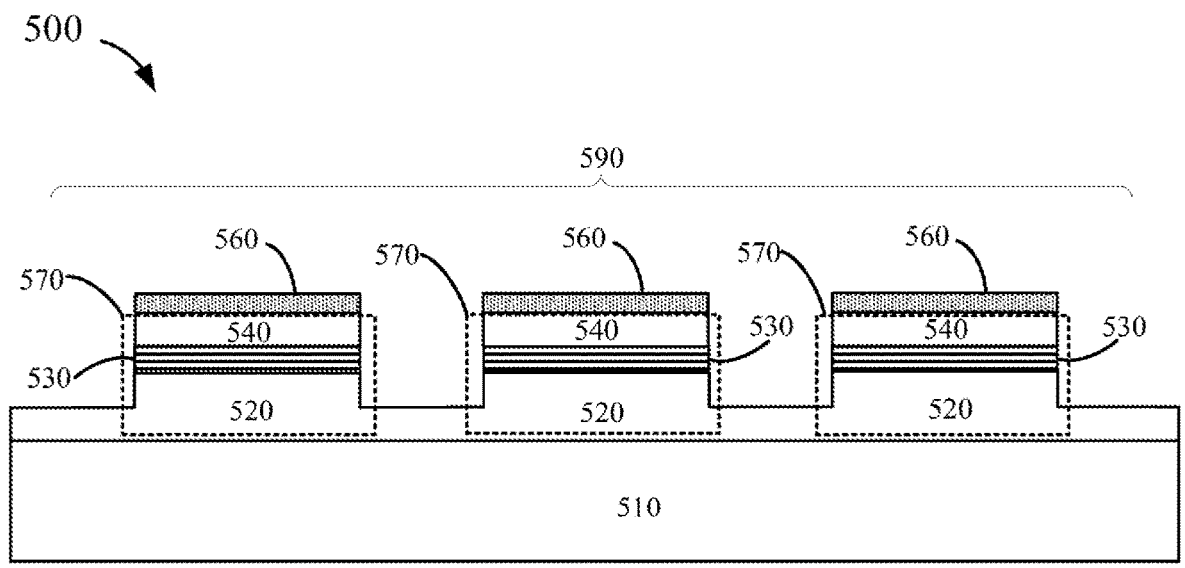
FIGS. 5A-5E illustrate cross sectional views of example epitaxial layered structures having various micropixellated structures according to certain embodiments.

As noted above, in some embodiments, LEDs, such as LEDs 400 and 405, may include multiple epitaxial layers. In some embodiments, the multiple epitaxial layers may form an epitaxial layered structure having a micropixellated structure. FIGS. 5A-5E illustrate cross-sectional views of various epitaxial layered structures having different micropixellated structures. Starting with FIG. 5A an example epitaxial layered structure 500 having a micropixellated structure 590 is provided. Epitaxial layered structure 500 may be part of an LED, such as LED 400 or LED 405. Epitaxial layered structure 500 may be part of a micro-LED made of inorganic materials, such as multiple layers of semiconductor materials. To form epitaxial layered structure 500 one or more semiconductor layers may be grown on a substrate 510. Substrate 510 may be the same as substrate 410. The one or more semiconductor layers grown on substrate 510 may include a semiconductor layer 520, a semiconductor layer 540, and one or more active layers 530. For example, semiconductor layer 520 may be grown on substrate 510. One or more active layers 530 may be grown on semiconductor layer 520 to form an active region, which in some embodiments may include a quantum wells layer. As illustrated in FIG. 5A, active layer 530 may be situated between semiconductor layer 520 and a semiconductor layer 540. Semiconductor layer 520 may be the same as semiconductor layer 420, active layers 530 may be the same as active layers 430, and semiconductor layer 540 may be the same as semiconductor layer 440. According to the embodiments depicted in FIG. 5A-5E, semiconductor layer 540 may be a first-type doped semiconductor layer and semiconductor layer 520 may be a second-type doped semiconductor layer. For example, semiconductor layer 540 may be a III-V material, such as GaN and may be p-doped (e.g., with Mg, Ca, Zn, or Be) and semiconductor layer 520 may be a III-V material, such as GaN and may be n-doped (e.g., with Si or Ge). In other embodiments, semiconductor layer 520 may be p-doped and semiconductor layer 540 may be n-doped.

Epitaxial layered structure 500 may include a micropixellated structure 590. Micropixellated structure 590 may include a pattern of conductive layer 560 deposited onto a surface of semiconductor layer 540. Conductive layer 560 may be the same as conductive layer 460 and may include an electrically conductive material. Conductive layer 560 may be adjacent to and in ohmic contact with semiconductor layer 540 such to allow transmission of charge (i.e., current) through epitaxial layered structure 500, specifically from a contact layer (not shown) through semiconductor layer 540, active layer 530, and semiconductor layer 520 to a secondary contact layer (not shown), when a voltage signal is applied to a micro-LED incorporating epitaxial layered structure 500.

Micropixellated structure 590 may include a plurality of mesa structures. The mesa structures of micropixellated structure 590 may correspond to the mesa structures of the micro-LED incorporating epitaxial layered structure 500. As such, the mesa structures may have any shape, as described above. For example, the mesa structures of micropixellated structure 590 may be planar, conical, semi-parabolic, parabolic, or have a vertical mesa structure as depicted in FIGS. 5A-5E.

Micropixellated structure 590 may include a plurality of micropixel contact areas. As illustrated in FIGS. 5A-5E, each of the plurality of micropixel contact areas may include conductive layer 560. Conductive layer 560 may be situated to be in ohmic contact with semiconductor layer 540. Each micro-LED may have a corresponding micropixel contact area. Each micropixel contact area may be positioned to transmit a charge (i.e., current) from a contact layer, such as an electrode, that is external to the micro-LED to epitaxial layered structure 500. Specifically, each micropixel contact area may be sized and spaced to allow current to flow from a contact layer, which is typically part of a back component, to semiconductor layer 540. In some embodiments, a micropixel contact area may also include a bond bump. In such embodiments, a bond bump may be positioned to be in electrical contact with conductive layer 560. Accordingly, micropixellated structure 590 may including a plurality of micropixel contact areas, each configured to contact a common contact layer (not shown) to allow a charge applied to each of conductive layer 560 to flow through semiconductor layer 540, active layer 530, and to semiconductor layer 520.

In some embodiments, micropixellated structure may include a plurality of micropixel regions 570. Micropixel regions 570 may be a region of epitaxial layered structure 500 that tunnels or focuses any charge (i.e., current) applied to the resulting micro-LED from conductive layer 560 to active layers 530 or, in some cases, to semiconductor layer 520. As depicted in FIG. 5A, in some embodiments micropixel regions 570 may include semiconductor layer 520, active layer 530, and semiconductor layer 540. In some embodiments, micropixel regions 570 may be the portion of epitaxial layered structure 500 from which light is emitted during activation of the associated micro-LEDs.

Each of micropixel regions 570 may focus or tunnel charge (i.e., current) introduced via conductive layer 560 by electrically isolating adjacent micropixel regions 570 from one another. The means of electrically isolated micropixel regions 570 from one another may vary depending on the micro-LED application and/or fabrication process. As illustrated in FIG. 5A, each of micropixel regions 570 may be electrically isolated from one another by a physical etch. During an etch process, a portion of each the epitaxial layer within epitaxial layered structure 500 may be etched. In some embodiments, an etch may continue through semiconductor layer 540, through active layer 530, and into semiconductor layer 520. The etch may stop somewhere within semiconductor layer 520. In some embodiments, however, the etch may continue through the entirety of semiconductor layer 520 and stop at substrate 510. By physically etching and removing portions of semiconductor layer 540 between adjacent conductive layers 560 an electrical short between adjacent conductive layers 560 may be prevented. Moreover, by continuing the etch through the entirety of semiconductor layer 540 between adjacent conductive layers 560, any charge applied to one conductive layer 560 may be focused and tunneled directly to the active layer 530 directly below the conductive layer 560 receiving the charge. Because of the lack of semiconductor layer 540 between adjacent conductive layers 560, when a charge is applied to conductive layer 560, the charge is direct downwards through semiconductor layer 540 within micropixel region 570, and through a concentrated region of active layer 530. This may provide for concentrated light emission from the corresponding micro-LED. By concentration the region of active layers 530 through which charge flows may also concentrate light emitted by the micro-LED. This may allow for focused light emission which can result in more crisp lines in an array of micropixels. In this way, micropixel regions 570 may act as insulating regions, thereby isolating each micropixel contact area and associated micropixel. In some embodiments, a dielectric material, such as dielectric layer 475 may be deposited in between adjacent micropixellated region 570. For example, a dielectric material may overlay a portion or the entirety of epitaxial layered structure 500, except for conductive layers 560 which may be left exposed.

Each of micropixel regions 570 within micropixellated structure 590 may be electrically isolated from one another. By electrically isolating one another, micropixellated structure 590 may allow for flexible alignment, and even alignment free, assembly of a micro-LED array formed using micropixellated structure 590 with a backplane. Epitaxial layered structure 500 may be part of and form a plurality of micro-LEDs in an array of micro-LEDs. During fabrication of micro-LED devices the array of micro-LEDs may be bonded to a backplane. For example, the backplane may be a passive substrate that facilitates connection to a fine pitch of a micro-LED array (e.g., by fanning out connections), a full customized drive IC, or a thin-film transistor based drive device. During assembly of conventional micro-LED arrays, a high degree of precision is typically required to align a wafer or diced portion of a wafer having the fabricated micro-LED structures, with corresponding sized features on a CMOS driver chip or backplane prior to bonding. This necessarily requires precise alignment with corresponding yield issues for small misalignment errors. For example, without proper alignment, charge may not flow through the micro-LEDs and the micro-LEDs may not function properly.

The micropixellated structures described herein, such as micropixellated structure 590, may allow for micropixel contact areas to be directly bonded to the backplane or driver, such as a CMOS driver chip, at the wafer scale without necessitating any precise alignment. By forming small micro-LEDs having electrically isolated micropixel contact areas on the same plane, an array of micro-LEDs may easily and with minimal alignment requirements be bonded to a back component, such as a backplane or driver. The micropixellated structures described herein may facilitate relaxed alignment or alignment free bonding because the plurality of micropixel contact areas may be sized and spaced to allow multiple ones of the micropixel contact areas to overlap with a single contact layer or contact pad (i.e., an electrode) on the corresponding back component. By providing multiple micropixel contact areas to overlap with a single contact layer, charge flow through associated micro-LEDs contacting the single contact layer may activate the associated micro-LEDs. Fabrication of micro-LEDs having a micropixellated structure may allow for wafer scale bonding and relaxed alignment requirements, and may improve micro-LED device production and provide for improved micro-LED devices since more than one activated micro-LED may be associated with a single micropixel.

Figure 5B:
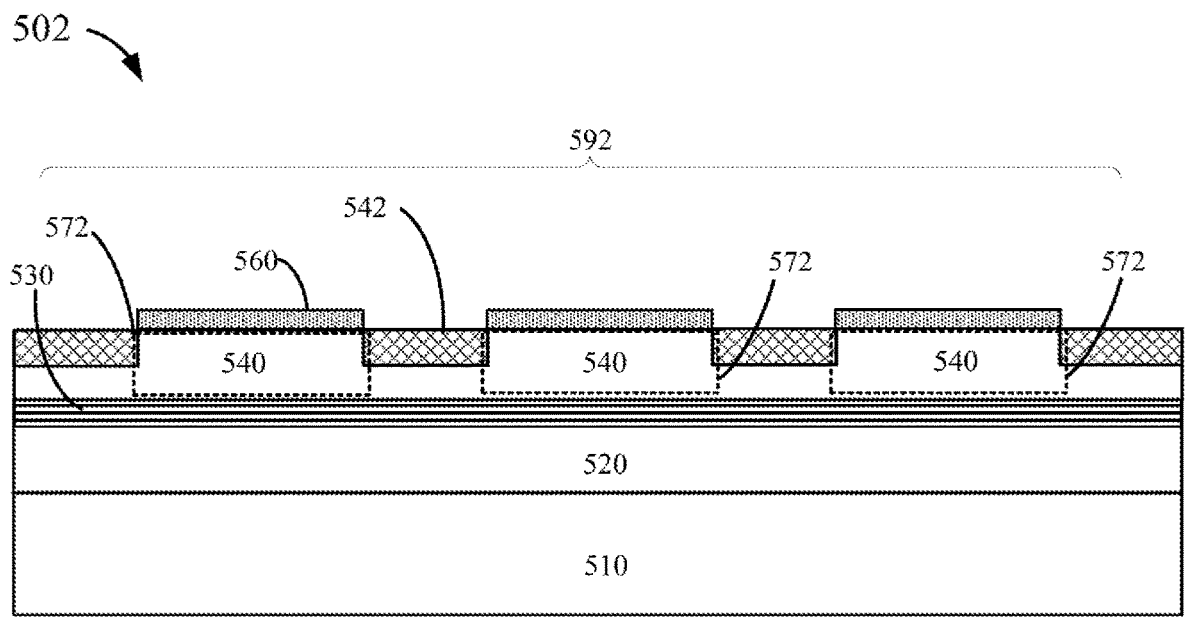

FIG. 5B illustrates a cross-sectional view of epitaxial layered structure 502. Epitaxial layered structure 502 may be the same as epitaxial layered structure 500, however, epitaxial layered structure 502 may include micropixellated structure 592. Micropixellated structure 592 may be formed via a different process than micropixellated structure 590 to produce micropixel regions 572. For example, micropixellated structure 592 may be formed via a plasma treatment process, in some cases including a subsequent annealing process. Exemplary plasma treatment processes, and associated annealing processes, may include those described in U.S. Pat. No. 10,211,371, which is hereby incorporated in its entirety by reference.

Micropixellated structure 592 may include a plurality of micropixel contact areas, which as illustrated includes conductive layer 560. Like micropixel regions 570, micropixel regions 572 may be electrically isolated from one another. To form micropixel regions 572, an upper layer 542 of semiconductor layer 540 may be converted to have modified conductive properties. For example, upper layer 542 may be modified into a non-conductive or insulating state. In some embodiments, upper layer 542 may include a portion of semiconductor layer 540 that has been converted to a non-conducting semiconductor species of semiconductor layer 540. Upper layer 542 may be modified such to reduce current flow through it. Although depicted as staggering, in some embodiments, a top surface of conductive layer 560 may be planar with the top surface of upper layer 542 of semiconductor layer 540.

In some embodiments, upper layer 542 may form micropixel regions 572 and act to funnel charge or current directly from conductive layer 560 through semiconductor layer 540. When a charge is applied to conductive layer 560, upper layer 542 of semiconductor layer 540 may reduce the occurrence of charge being laterally dispersed within semiconductor layer 540. Upper layer 542 is capable of doing so using its modified conductive properties, which in some embodiments may be non-conductive or insulating. The depth of upper layer 542 may determine the extent to which charge is prevented from dispersing laterally once introduced into semiconductor layer 540. For example, in some embodiments, upper layer 542 may extend vertically all the way through semiconductor layer 540 to active layers 530. In such an embodiment, when a charge is applied to conductive layer 560, the charge may be prevented from dispersing laterally within semiconductor layer 540 and may flow directly from conductive layer 560 through semiconductor layer 540 to active layers 530. The extent to which charge is allowed to laterally disperse within semiconductor layer 540 may correspond to the degree that light emission from active layers 530 is concentrated. As charge is allowed to laterally disperse within semiconductor layer 540, a greater area of active layers 530 may be activated (i.e., emitting light), resulting in a gradient of light emission from the associated micro-LED array. There may be a stronger emission of light from active layers 530 directly under conductive layer 560, however, the further away from conductive layer 560 the activated active layer 530 are, the weaker the light emission may be. Forming a gradient of light emission may be undesirable because it may result in blurry image quality from corresponding micropixels. In some embodiments, concentrated light emission from a micro-LED array may be desirable.

Figure 5C:
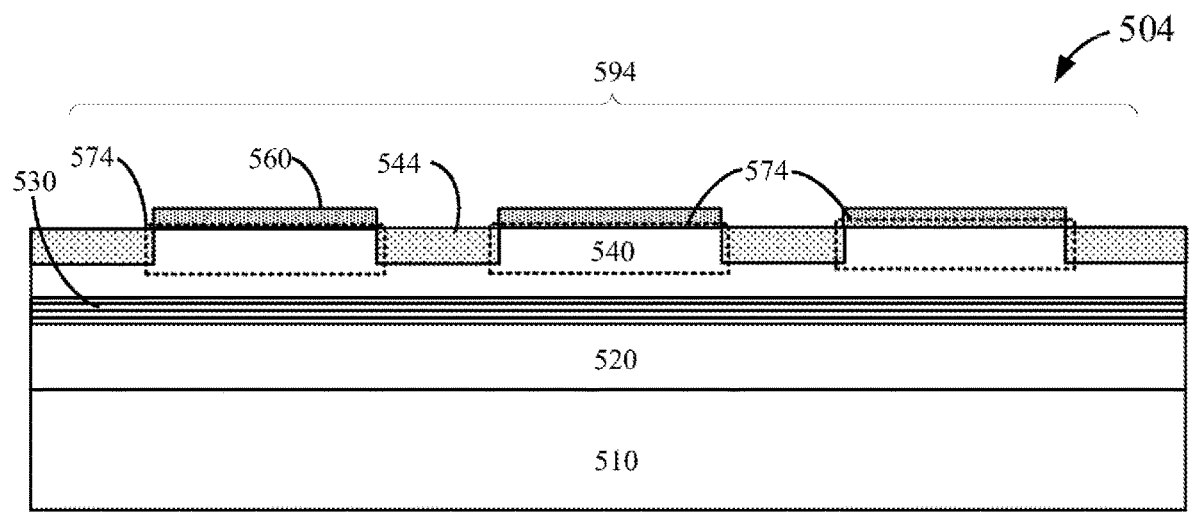

FIG. 5C illustrates a cross-sectional view of epitaxial layered structure 504. Epitaxial layered structure 504 may be the same as epitaxial structure layer 500 or 502, however, epitaxial layered structure 504 may include micropixellated structure 594. Micropixellated structure 594 may be formed via a different process than micropixellated structure 590 or micropixellated structure 592 to produce micropixel regions 574. For example, micropixellated structure 594 may be formed via an ion implantation process. During an ion implantation process, energetic ions may be embedded within an upper layer 544 of semiconductor layer 540. The ion implantation process may affect the semiconductor material of upper layer 544. The conductive properties of upper layer 544 may become modified during ion implantation. For example, the lattice structure of upper layer 544 may become less electrically conductive, so that current does not spread laterally throughout upper layer 544 of semiconductor layer 540. Instead, as illustrated in FIG. 5C, current may be funneled vertically through semiconductor layer 540 directly below conductive layer 560. The modification of the conductive properties of upper layer 544 may vary depending on the species of ions implanted and the degree (i.e., amount, depth, excitation, etc.) of ions implanted within upper layer 544 of semiconductor layer 540.

Similar to upper layer 542, upper layer 544 may form micropixel regions 574 which are electrically isolated from one other. Micropixel regions 574 may prevent a charge from laterally dispersing immediately upon entering semiconductor layer 540 when a charge is applied to conductive layer 560. In this manner, micropixel regions 574 may allow for concentrated activation of active layers 530, and thereby may allow for more focused light emission than if charge was allowed to laterally disperse directly after entering semiconductor layer 540 from conductive layer 560.

Figure 5D:
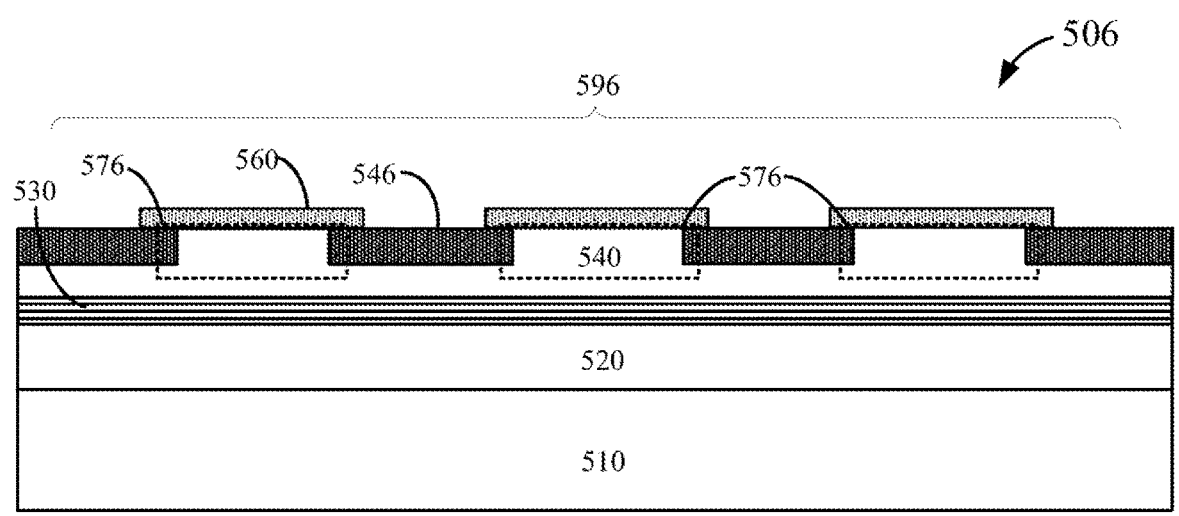

In some embodiments, micropixellated regions may be electrically isolated by means of ion diffusion. FIG. 5D illustrates a cross-sectional view of epitaxial layered structure 506. Epitaxial layered structure 506 may be the same as epitaxial structure layer 500, 502, or 504, however, epitaxial layered structure 506 may have micropixellated structure 596. Micropixellated structure 596 may include a plurality of micropixel regions 576 formed via an ion diffusion process. During an ion diffusion process, an upper layer 546 of semiconductor layer 540 may be formed having modified conductive properties. The ion diffusion process, like the ion implantation process, may modify the conductive properties of the semiconductor material of upper layer 546. For example, the lattice structure of upper layer 546 may become less electrically conductive, so that current does not spread through the entire structure in all direction. Instead, as illustrated in FIG. 5D, current may be funneled vertically through semiconductor layer 540 directly below conductive layer 560 to active layers 530. In some embodiments, upper layer 546 may be insulating or non-conductive. Upper layer 546 may form electrically isolated micropixel regions 576 by preventing charge flowing from conductive layer 560 from laterally dispersing upon entering semiconductor layer 540.

In aspects, upper layer 546 formed by an ion diffusion process may differ from upper layer 544 formed by an ion implantation process. One difference may be that upper layer 546 formed by an ion diffusion process may include modified portions of semiconductor layer 540 directly under conductive layer 560. This may be due in part because ion diffusion processes allow for lateral diffusion and may cause modification of material in a lateral or horizontal direction. The resulting upper layer 546 which includes portions of semiconductor layer 540 that are directly below conductive layer 560 may tunnel charge flowing from conductive layer 560 to a concentrated region of active layers 530. As noted above, tunneling charge from conductive layer 560 may provide for a stronger light emission than if the charge was allowed to laterally disperse immediately upon entering semiconductor layer 540. In some embodiments, the greater the tunneling of charge between conductive layer 560 and active layers 530, the more concentrated the region of activated active layers 530 may be and thus the more concentrated light emission may be from the activated active layers 530.

Figure 5E:
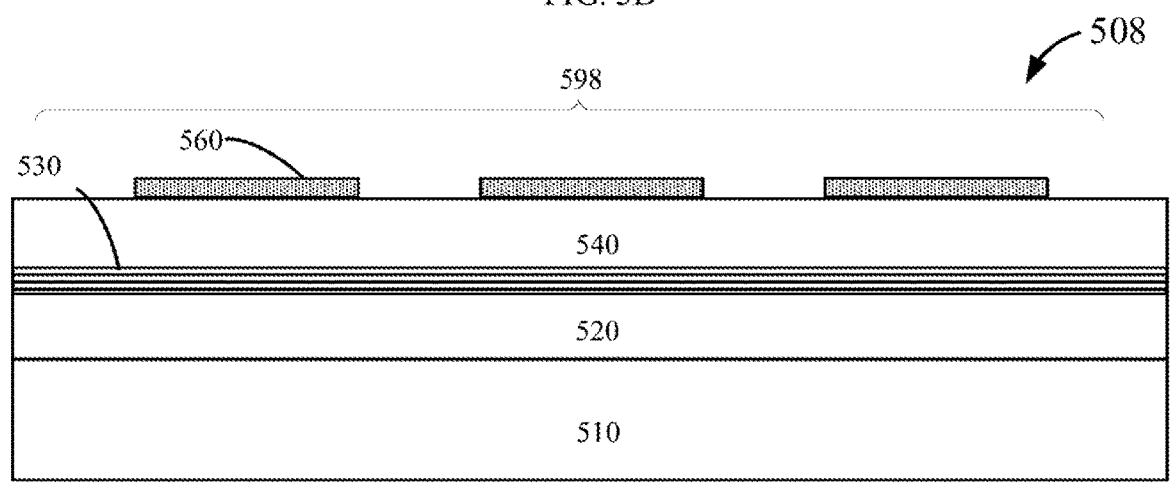

In FIG. 5E, an epitaxial layered structure 508 is depicted illustrating a micropixellated structure 598. Epitaxial layered structure 508 may be the same as epitaxial layered structures 500, 502, 504, or 506, except epitaxial layered structure 508 may include a micropixellated structure 598. Micropixellated structure 598 may be formed from a different process than previously discussed micropixellated structures. Micropixellated structure 598 may include a plurality of micropixel contact areas, which as depicted include conductive layers 560. During formation of micropixellated structure 598, conductive layer 560 may overlay semiconductor layer 540. To electrically isolate a plurality of micropixel contact areas, portions of conductive layer 560 may be removed. Conductive layers 560 may be sized and spaced such to ensure electrical isolation between adjacent conductive layers 560 and prevent short circuiting when a charge is applied adjacent conductive layers 560. In the embodiment depicted in FIG. 5E, semiconductor layer 540 may not undergo any treatment or etching. When a charge is applied to conductive layer 560, the charge may disperse laterally because semiconductor layer 540 is untreated. As discussed above, this may allow for a greater area of active layers 530 to be activated. In some embodiments, this may be desirable. In other embodiments, however, the conductive layers 560 may be sized and spaced to direct charge flow directly through semiconductor layer 540 to active layers 530 with minimal laterally dispersion. For example, in some embodiments, conductive layers 560 may be sized to provide an increased amount of charge to semiconductor layer 540. The amount of charge applied may impact the lateral dispersion of charge through semiconductor layer 540. The application of a greater amount of current may reduce lateral dispersion than application of a smaller amount of current.

Although FIGS. 5A-5E depict only three micropixel regions 570, 572, 574, and 576, and three corresponding micropixel contact areas, micropixellated structures 590, 592, 594, 596, and 598 may include any number of micropixel contact areas. For example, a micropixellated structure provided herein may include from 2 to 1,000 micropixel contact areas, from 5 to 750 micropixel contact areas, from 10 to 500 micropixel contact areas, from 10 to 250 micropixel contact areas, from 10 to 100 micropixel contact areas, or any other amount of micropixel contact areas.

The size and spacing of the micropixel contact areas may provide for flexible alignment of a micro-LED array to a back component (i.e., backplane or driver) during assembly of a micro-LED device. One or two-dimensional arrays of the micro-LEDs described above may be manufactured on a wafer to form light sources. Driver circuits may be fabricated, for example, on a silicon wafer using CMOS processes. The LEDs and the driver circuits on wafers may be diced and then bonded together, or may be bonded on the wafer level and then diced. Various bonding techniques can be used for bonding the micro-LEDs and the driver circuits, such as adhesive bonding, metal-to-metal bonding, metal oxide bonding, wafer-to-wafer bonding, die-to-wafer bonding, hybrid bonding, eutectic solder and the like.

Regardless of the method used, when conventional techniques and conventionally formed micro-LEDs are bonded, alignment of the micro-LEDs during bonding with corresponding features on a back component may generally be required. Any variation or misalignment may reduce the yield of light emission from the micro-LED array or even an ineffective micro-LED device. For explanation purposes, FIGS. 6A and 6B are provided and discussed with reference to conventional bonding methods.

FIG. 6A illustrates an example of a method of die-to-wafer bonding for arrays of micro-LEDs according to certain embodiments. In the example shown in FIG. 6A, a micro-LED array 601 may include a plurality of micro-LEDs 607 on a carrier substrate 605. Carrier substrate 605 may include various materials, such as GaAs, InP, GaN, AlN, sapphire, SiC, Si, or the like. MircoLEDs 607 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more active layers (i.e., quantum wells or MQWs). The electrical contacts of micro-LEDs 607 may include various conductive materials, such as a metal or a metal alloy.

A wafer 603 may include a base layer 609 having passive or active integrated circuits (e.g., driver circuits 611) fabricated thereon. Base layer 609 may include, for example, a silicon wafer. Driver circuits 611 may be used to control the operations of micro-LEDs 607. For example, the driver circuit for each micro-LED 607 may include a 2T1C pixel structure that has two transistors and one capacitor. Wafer 603 may also include a bonding layer 613. Bonding layer 613 may include various materials, such as a metal, an oxide, a dielectric, CuSn, AuTi, and the like. In some embodiments, a patterned layer 615 may be formed on a surface of bonding layer 613, where patterned layer 615 may include a metallic grid made of a conductive material, such as Cu, Ag, Au, Al, or the like.

micro-LED array 601 may be bonded to wafer 603 via bonding layer 613 or patterned layer 615. For example, using conventional techniques, patterned layer 615 including metal pads or bumps made of various materials, such as CuSn, AuSn, or nanoporous Au, may be used to align micro-LEDs 607 of micro-LED array 601 with corresponding driver circuits 611 on wafer 603. For example, using conventional techniques micro-LED array 601 may be brought toward wafer 603 until micro-LEDs 607 come into contact with respective metal pads or bumps corresponding to driver circuits 611. Some or all of micro-LEDs 607 may be aligned with driver circuits 611, and may then be bonded to wafer 603 via patterned layer 615 by various bonding techniques, such as metal-to-metal bonding. After 6icroLEDs 607 have been bonded to wafer 603, carrier substrate 605 may be removed from micro-LEDs 607.

FIG. 6B illustrates an example of a method of wafer-to-wafer bonding for arrays of LEDs according to certain embodiments. As shown in FIG. 6B, a first wafer 602 may include a substrate 604, a first semiconductor layer 606, active layers 608, and a second semiconductor layer 610. Substrate 604 may include various materials, such as GaAs, InP, GaN, AlN, sapphire, SiC, Si, or the like. First semiconductor layer 606, active layers 608, and second semiconductor layer 610 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 606 may be an n-type layer, and second semiconductor layer 610 may be a p-type layer. For example, first semiconductor layer 606 may be an n-doped GaN layer (e.g., doped with Si or Ge), and second semiconductor layer 610 may be a p-doped GaN layer (e.g., doped with Mg, Ca, Zn, or Be). Active layers 608 may include, for example, one or more GaN layers, one or more InGaN layers, one or more AlInGaP layers, and the like, which may form one or more heterostructures, such as one or more quantum wells or MQWs.

In some embodiments, first wafer 602 may also include a bonding layer. Bonding layer 612 may include various materials, such as a metal, an oxide, a dielectric, CuSn, AuTi, or the like. In one example, bonding layer 612 may include p-contacts and/or n-contacts (not shown). In some embodiments, other layers may also be included on first wafer 602, such as a buffer layer between substrate 604 and first semiconductor layer 606. The buffer layer may include various materials, such as polycrystalline GaN or AlN. In some embodiments, a contact layer may be between second semiconductor layer 610 and bonding layer 612. The contact layer may include any suitable material for providing an electrical contact to second semiconductor layer 610 and/or first semiconductor layer 606.

First wafer 602 may be bonded to wafer 603 that includes driver circuits 611 and bonding layer 613 as described above, via bonding layer 613 and/or bonding layer 612. Bonding layer 612 and bonding layer 613 may be made of the same material or different materials. Bonding layer 613 and bonding layer 612 may be substantially flat. First wafer 602 may be bonded to wafer 603 by various methods, such as metal-to-metal bonding, eutectic bonding, metal oxide bonding, anodic bonding, thermo-compression bonding, ultraviolet (UV) bonding, and/or fusion bonding.

As shown in FIG. 6B, first wafer 602 may be bonded to wafer 603 with the p-side (e.g., second semiconductor layer 610) of first wafer 602 facing down (i.e., toward wafer 603). After bonding, substrate 604 may be removed from first wafer 602, and first wafer 602 may then be processed from the n-side. The processing may include, for example, the formation of certain mesa shapes for individual LEDs, as well as the formation of optical components corresponding to the individual LEDs.

Another method of bonding may include hybrid bonding for arrays of micro-LEDs. Hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. In some embodiments where the two bonded wafers include materials having different coefficients of thermal expansion (CTEs), the dielectric materials bonded at room temperature may help to reduce or prevent misalignment of the contact pads caused by the different thermal expansions. Thermal expansion of materials having different CTEs, however, may still be problematic at certain operating conditions. In some embodiments, to further reduce or avoid the misalignment of the contact pads at a high temperature during annealing, trenches may be formed between micro-LEDs, between groups of micro-LEDs, through part or all of the substrate, or the like, before bonding.

Figure 7A:
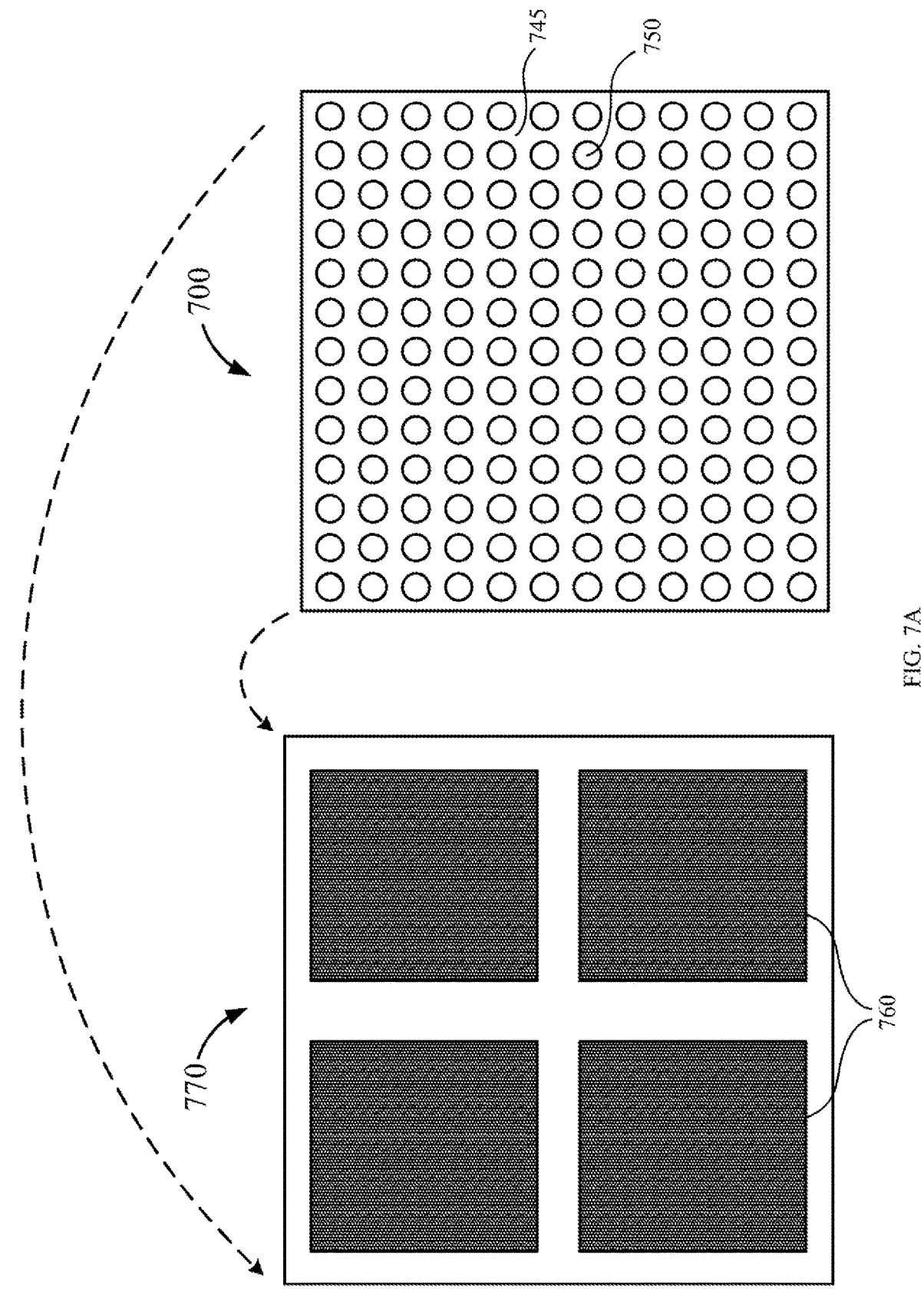
FIGS. 7A and 7B illustrate a flexible bonding method of a micro-LED array having a micropixellated structure according to certain embodiments.

Turning now to FIG. 7A, a flexible bonding method may be provided. The embodiment illustrated in FIG. 7 may include any bonding method, including those described with respect to FIGS. 6A and 6B, except any alignment requirements of the bonding method may be relaxed or inapplicable. Alignment requirements of a micro-LED array 700 with a backplane 770 may minimized in part because micro-LED array 700 includes a micropixellated structure as provided herein. For example, micro-LED array 700 may include a micropixellated structure such as micropixellated structure 590, 592, 594, 596, or 598. The micropixellated structure of micro-LED array 700 may include a plurality of micropixel contact areas 750. The micropixel contact areas 750 may be metal based ohmic contacts, e.g. NiAu based contacts or metal based Schottky contacts. In some embodiments, the micropixel contact areas 750 may comprise transparent conductive oxides, e.g. indium tin oxide, which may form an ohmic contact with an upper semiconductor layer, such as a p-type doped semiconductor layer. Each of the micropixel contact areas 750 may be electrically isolated from one another by insulating region 745. Insulating region 745 may including various insulating or non-conductive materials. In some embodiments, insulating region 745 may include an upper layer of a semiconductor layer having modified conductive properties. For example, insulating region 745 illustrated in FIG. 7A may be the same as upper layer 542, 544, or 546. In other embodiments, insulating region 745 may include a dielectric material, such as SiC, $SiO_2$, SiN, $Al_2O_3$, $HfO_2$, $ZrO_2$, $Ta_2O_5$, or the like, which overlays a modified upper layer or an upper semiconductor layer, such as semiconductor layer 540.

As illustrated, micro-LED array 700 may configured to bond with backplane 770. In some embodiments, backplane 770 may be a drive IC, a driver chip, or any another component to be bonded to micro-LED array 700. For example, backplane 770 may be circuits for pulse width modulation (PWM), a memory chip to hold pixel values, or a multiplexer. In other examples, the micro-LED array 700 may be bonded to a thin film transistor (TFT) based drive circuit on a substrate such as glass. Other configurations could include IGZO based drive electronics on various transparent substrates. Backplane 770 may include one or more contact pads 760. Contact pads 760 may include any suitable material for providing an electrical contact to micropixel contact areas 750. In some embodiments, contact pads 760 may be a common electrode, such as a common cathode or anode, for one or more of micropixel contact areas 750.

Figure 7B:
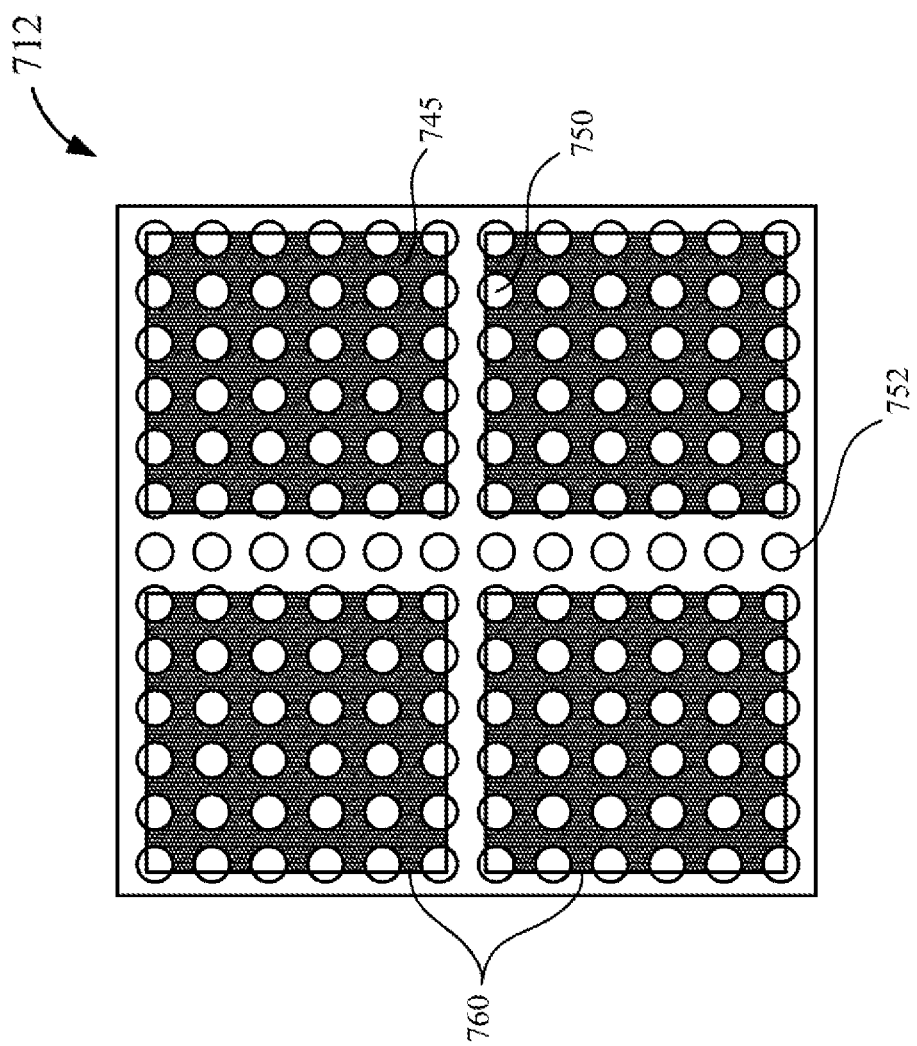

Micropixel contact areas 750 may be sized and spaced such that one or more of micropixel contact areas 750 overlay and contact one of contact pads 760. As illustrated in FIG. 7B, contact pads 760 may be sized such to contact more than one micropixel contact areas 750. FIG. 7B may depicted assembly 712 in which backplane 770 is bonded to micro-LED array 700. Micropixel contact areas 750 which overlay contact pads 760 may be in electrical contact with contact pads 760. When a micropixel contact area 750 is in electrical contact with a contact pad 760, a charge (or current) may transfer from contact pad 760 through micropixel contact area 750 to the underlying epitaxial layered structure. For example, when contact pad 760 is activated a charge may flow through micropixel contact area 750 and through the corresponding micro-LED structure to emit light from the micro-LED. Because a single contact pad 760 may overlay more than one micropixel contact area 750, a single contact pad 760 may activate more than one micro-LED at a time. For example, contact pads 760 may each overlay and be in contact with a plurality of micropixel contact areas 750 such to allow activation of more than five micropixel contact areas 750, more than ten micropixel contact areas 750, more than 20 micropixel contact areas 750, or more than 50 micropixel contact areas 750, and thereby realize the associated micro-LEDs. In some embodiments, assembly 712 may include one or more inactivated micropixel contact areas 752. When a micropixel contact area 750 does not overlay (or contact) contact pad 760, then that micropixel contact area 750 may be an inactivated micropixel contact area 752. Inactivated micropixel contact areas 752 may not flow charge from contact pads 760 to a corresponding micro-LED because inactivated micropixel contact area 752 is not in electrical contact with contact pads 760.

The amount of micropixel contact areas that overlay and contact a contact pad, such as contact pads 760, may vary depending on the size and spacing of micropixel contact areas. It may be desirable to have additional micropixel contact areas (i.e., micropixel contact areas that may not overlay a contact pad such as inactivated micropixel contact areas 752). The number of micropixel contact areas may directly correspond to the number of micro-LEDs in an array. As such depending on the standard alignment accuracy of wafer-to-wafer, chip-to-water, or chip-to-chip bonding techniques excess micro-LEDs that will not be activated may be included in a micro-LED array. For example, in some embodiments, a periphery amount of excess micro-LEDs may be provided around the micro-LEDs determined to be activated by contact pad 760. In some embodiments, less than 100 μm of excess micro-LEDs may be formed around the periphery of micro-LED array 700 to allow for relaxed alignment.

Figure 8:
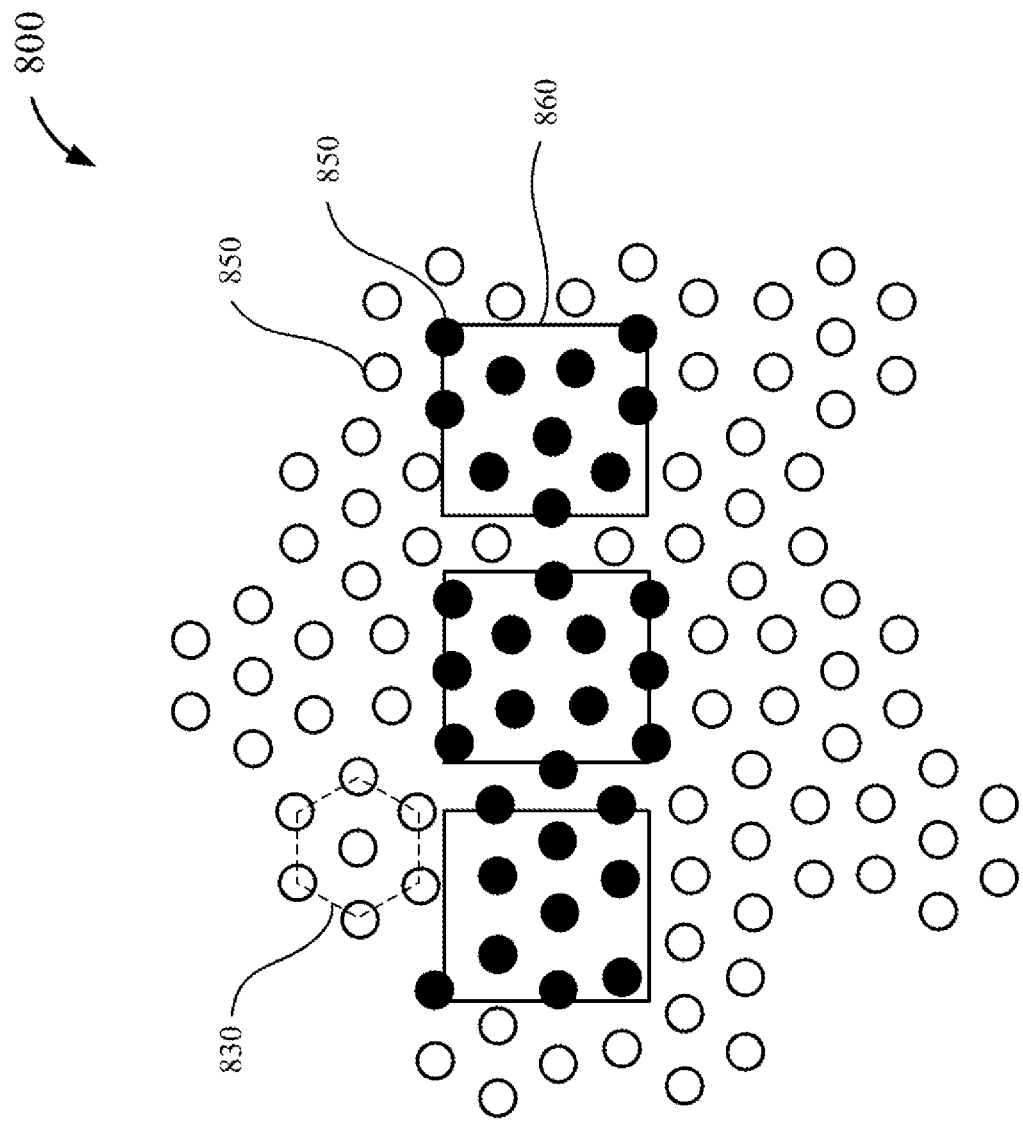
FIG. 8 illustrates a segment of an example micro-LED array having a micropixellated structure overlaying a plurality of contact pads according to certain embodiments.

In some embodiments, the micropixellated structure of a micro-LED array may have a pattern of micropixel contact areas. The pattern of micropixel contact areas may directly correlate to a pattern of resulting micro-LEDs. As illustrated in FIG. 8, in some embodiments, a micro-LED array 800 may have a micropixellated structure including a plurality of micropixel contact areas 850 formed in a closely-packed hexagonal pattern 830. The pattern of micropixel contact areas 850 within the micropixellated structure may vary depending on application. The pattern of micropixel contact areas 850 may affect the packing or amount of micropixel contact areas 850 that may be activated by a contact pad of a give size. For example, as illustrated in FIG. 8, closely-packed hexagonal pattern 830 may allow for five or more micropixel contact areas 850 to be activated by contact pad 860 at a given time. Various patterns of micropixel contact areas 850 may be formed depending on application and spacing requirements. In some embodiments, a micropixellated structure may form a square pattern of micropixel contact areas 850. Any pattern of micropixel contact areas 850 may be feasible and may include, for example, a circular pattern, a triangular pattern, a pentagonal pattern, a chevron pattern, a lined patterned (i.e., micropixel contact areas 850 are arranged in lines or rows), or a random pattern in which micropixel contact areas 850 are spaced and positioned at random or in an organized random pattern. Regardless of the pattern of micropixel contact areas 850 within the micropixellated structure, the sizing and spacing of each micropixel contact area 850 may be such that one or more of the micropixel contact areas 850 overlay and contact a contact pad, such as contact pad 860.

Contact pad 860 may be the same as contact pad 760. In some embodiments, contact pad 860 may be an anode, while in other embodiments contact pad 860 may be a cathode. The size of contact pad 860 vary in size depending on application, and can be any size required by the resulting micro-LED device. For example, in some embodiments contact pad 860 may be have a contact area ranging from approximately 0.01 $mm^2$ to less than 25 $\mu m^2$.

As illustrated in FIG. 8, more than one of micropixel contact areas 850 may contact and overlay contact pad 860. When more than one micropixel contact areas 850 overlays, and therefore contacts, contact pad 860 current may flow from contact pad 860 to the micropixel contact area 850. When current flows from contact pad 860 to one or more micropixel contact areas 850, the micro-LED associated with each of the micropixel contact areas 850 contacting contact pad 860 may be active. Micropixel contact areas 850 may be shaded in FIG. 8 to illustrate that an associated micro-LED is activated because the corresponding micropixel contact areas 850 overlay and therefor are in electrical contact with contact pad 860. In some embodiments, the entirety of a single micropixel contact area 850 may overlay contact pad 860 and thereby be activated. In other embodiments, however, only a portion of a single micropixel contact area 850 may overlay contact pad 860. In such embodiments, the underlying micro-LED may still be activated and emit light. The degree by which a single micropixel contact area 850 overlays contact pad 860 may not affect whether the micropixel contact area 850 and the associated micro-LED are activated. If any portion of micropixel contact area 850 overlays and is in electrical contact with contact pad 860, the corresponding micro-LED may be activated. Micropixel contact areas 850 which do not overlay any portion of contact pad 860, indicated by the white filled micropixel contact areas 850 on FIG. 8, may not be in electrical contact with or receive any current from contact pad 860, and therefore may not activate any associated micro-LEDs. The sizing of the individual micropixel contact areas 850 and the spacing between the contacts 850 may be designed such that it is not possible for adjacent contacts 860 to be connected together via any contact 850. i.e. the diameter of contact 850 is below the spacing of the contacts 860.

By forming a micropixellated structure having a plurality of micropixel contact areas 850, alignment of micropixel contact areas 850 with contact pads 860 may not be necessary. Instead, micro-LED array 800 may be bonded with a corresponding back component, such as backplane 770, and a proportion of micro-LEDs associated with micropixel contact areas 850 may be activated by contact pads 860. In this manner, the micropixellated structure described herein may provide for relaxed or alignment-free bonding of a micro-LED array to a backplane or other corresponding back component (i.e., driver chip).

While not explicitly shown in the figures, in many embodiments, a plurality of microLEDs may share a common anode or a common cathode as a second contact. Each microLED may be individually controlled by applying a particular voltage for a particular duration (e.g., by using pulse width modulation) that corresponds to the brightness of a particular pixel, using the micropixellated structure described herein as a first contact. Thus, the microLEDs may be individually controlled. However, a plurality of microLEDs that are individually controlled through such first contacts may share a common second contact, such as a common anode or common cathode. This is analogous to the microLEDs having a "common ground." Typically, such a second contact to the plurality of micro LEDs is fabricated on the microLED array either before or after bonding. This may be a metallic grid forming an ohmic contact over the entire surface of the device (520) or a transparent conductive oxide on surface 520. For example, this may be a common cathode connection in the case where the individual micropixels form anode connections to p-type material, or a common anode connection for the reverse situation where the micropixels are an array of contacts onto the n-type material. In some situations, the common contact can only be fabricated after removal of the substrate.

After an array of micro-LEDs is bonded to a backplane or driver, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer (i.e., semiconductor layer 520) of the micro-LEDs. In some embodiments, the secondary optical components may be fabricated in a dielectric layer deposited on the n-type side of the micro-LEDs.

Various secondary optical components, such as a spherical micro-lens, a grating, a micro-lens, an antireflection layer, and the like, may be formed in or to be in contact with the n-type layer (i.e., semiconductor layer 520). The secondary optical components may be light extraction features which are positioned to collate light emitted from the micropixels within the micro-LED array. For example, spherical micro-lens arrays may be etched in the semiconductor materials of micro-LEDs using a gray-scale mask and a photoresist with a linear response to exposure light, or using an etch mask formed by thermal reflowing of a patterned photoresist layer. The secondary optical components may also be etched in a dielectric layer deposited on n-type layer using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiC, $SiO_2$, SiN, $Al_2O_3$, $HfO_2$, $ZrO_2$, $Ta_2O_5$, or the like. In some embodiments, a single micro-LED in a micro-LED array may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. In some embodiments, the micro-lens array may be formed into the common transparent conductive oxide contact on the secondary surface, e.g. etched into a common cathode fabricated from indium tin oxide.

Figure 9:
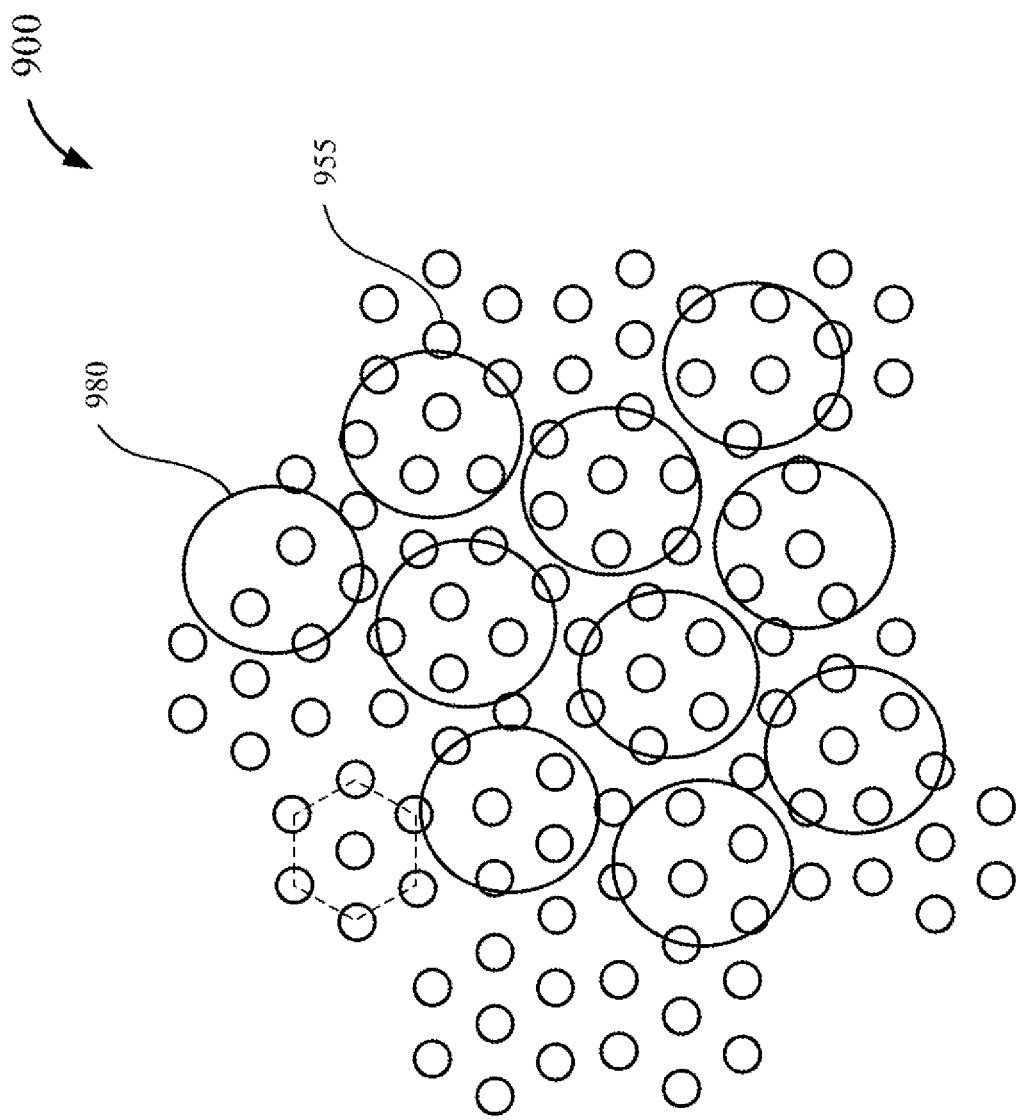
FIG. 9 illustrates a segment of an example micro-LED array having a plurality of light extraction features fabricated thereon according to certain embodiments.

The micropixellated structure of the micro-LEDS described herein may also allow for relaxed or even misalignment of secondary optical components with the micro-LEDs. FIG. 9 illustrates a segment of micro-LED array 900 having a micropixellated structure onto which a plurality of light extraction features 980 have been fabricated. Micro-LED array 900 may include a plurality of micro-LEDs 955. Each of micro-LEDs 955 may be part of a micropixellated structure having a corresponding micropixel contact area, such as micropixel contact area 850. FIG. 9 may depict a view of micro-LED array 900 looking through the n-type layer (i.e., semiconductor layer 520) of the epitaxial layered structure of each micro-LED 955. In other words, FIG. 9 may provide a bottom-up view, looking up from a substrate, as compared to FIG. 8 which may provide a top-down view of a micro-LED array. As oriented in FIG. 9, micro-LEDs 955 may be positioned to emit light towards light extraction features 980. Light extraction features 980 may be any secondary optical component described herein and may be configured to collate light emitted from a plurality of micro-LEDs 955.

In the embodiment depicted in FIG. 9, micro-LEDs 955 within micro-LED array 900 may be formed in a closely-packed hexagonal pattern. It should be noted, that the pattern of micropixel contact areas may be the same as the pattern of micro-LEDs. Thus, the respective micropixel contact areas for each of micro-LEDs 955 may have the same closely-packed hexagonal pattern. In some embodiments, light extraction features 980 may be formed in a pattern. For example, as illustrated in FIG. 9, light extraction features 980 may also form a closely-packed hexagonal pattern, however, in various embodiments the pattern of light extraction features 980 may not match the pattern of micro-LEDs 955.

In some embodiments, light extraction features 980 may be etched into the substrate (not shown) on which micro-LEDs 955 are situated. In other embodiments, light extraction features 980 may be patterned using photonic crystals, etching roughening, imprinting from a patterned sapphire during growth of epitaxial layered structure, or light extraction features 980 may be formed via deposition of a secondary dielectric material with patterning (i.e., microlenses on a fused silica substrate).

Regardless of the patterning and formation of light extraction features 980, there may be no requirement to align the patterning of light extraction features 980 with the patterning of micro-LEDs 955. In fact, light extraction features 980 may vary in size and shape as compared to micro-LEDs 955. A discrepancy in size of light extraction features 980 versus micro-LEDs 955 may be sufficient to ensure that an acceptable amount of light is extracted from micro-LEDs 955. For example, as illustrated in FIG. 9, light extraction features 980 may be larger than an individual micro-LED 955. This may allow for a single light extraction feature 980 to collect and collate light from more than one micro-LED 955. In some cases, a single light extraction feature 980 may collect light from two or more micro-LEDs 955, three or more micro-LEDs 955, five or more micro-LEDs 955, 10 or more micro-LEDs 955, or 25 or more micro-LEDs 955. A light extraction feature 980 may be sized and positioned to collected light from any number of micro-LEDs 955.

In various embodiments, light extraction features 980 may be the same size and align with the patterning of micropixellated structure. For example, in one such embodiment, a single light extraction feature 980 may be the same size and align directly with a single micro-LED 955. In this case, it may be desirable to align the two patterns, the pattern of light extraction features 980 and the pattern of the micropixellated structure of micro-LED array 900, such that only light emitting micro-LEDs 955 align with light extraction features 980. Although not show, on the opposite side of micro-LEDs 955, corresponding micropixel contact areas for each micro-LED 955 may bonded to a backplane. For example, each of micro-LEDs 955 may have a micropixel contact area, such as micropixel contact areas 850, and as described in FIG. 8, only a portion of the micropixel contact areas may overlay and contact a contact pad, such as contact pad 860. As such, only a portion of micro-LEDs 955 within micro-LED array 900 may be activated and emit light. A portion of micro-LEDs 955 may not emit light. Thus, it may be desirable to only align light extraction features 980 with micro-LEDs 955 that emit light. To facilitate such an alignment, micro-LEDs 955 may include a transparent material in some embodiments. For example, micro-LEDs 955 may include GaN-based semiconductor layers which may allow micro-LEDs 955 to be transparent to visible light. In another case, alignment of light extraction features 980 with activated micro-LEDs 955 may include activating micro-LEDs 955 (i.e., providing an electrical drive signal to micro-LEDs 955 from a bonded driver IC) such that the activated micro-LEDs 955 emit light. Using the emitting light, light extraction features 980 may be aligned with the activated (i.e., light emitting) micro-LEDs 955. Similar techniques may be used for other lithographic steps.

Figure 10:
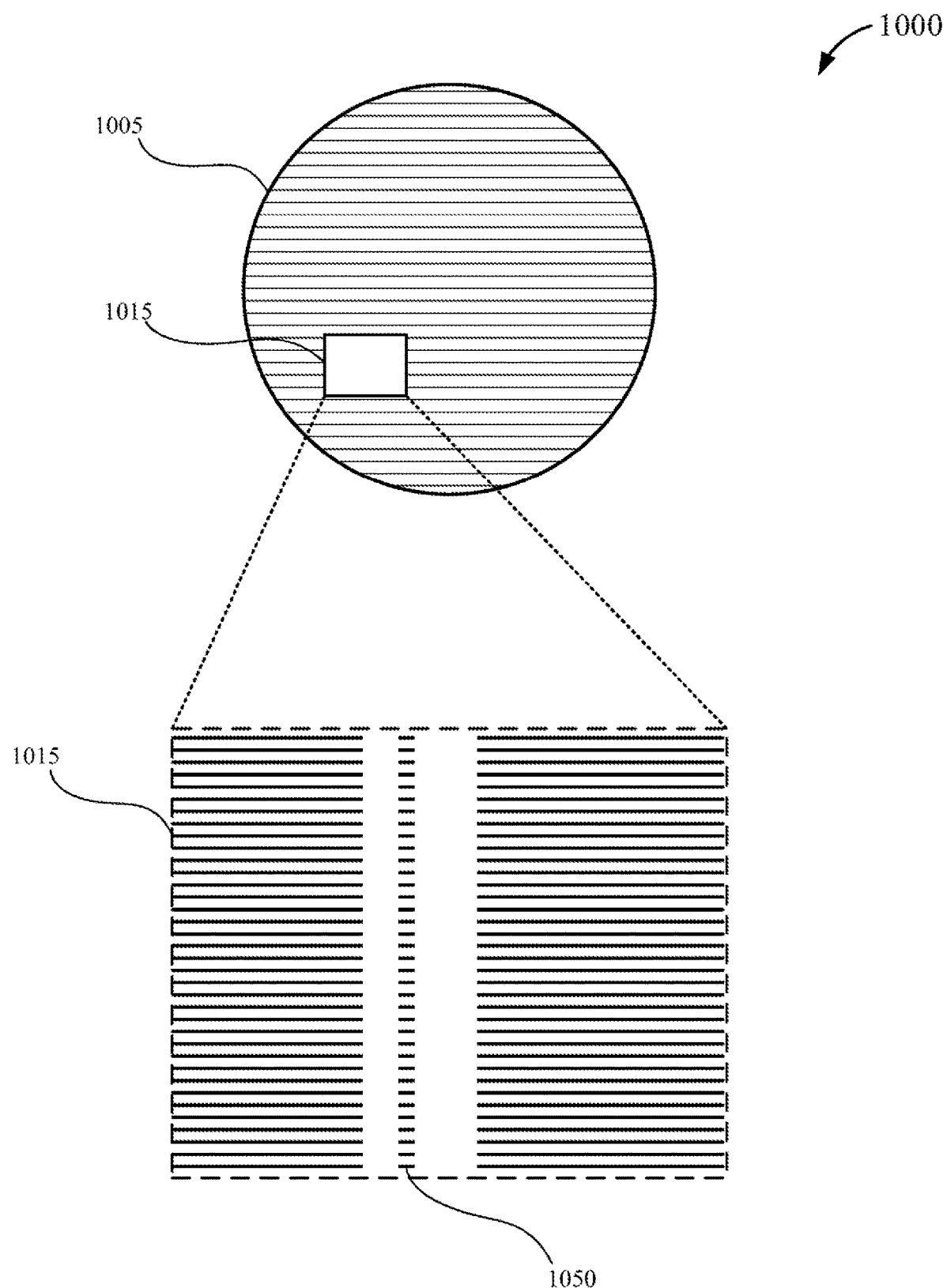
FIG. 10 illustrates an example micro-LED strip having a micropixellated structure according to certain embodiments.

In some embodiments, the micropixellated structure of a given micro-LED array may not be symmetrical or even ensure electrical isolation in two dimensions. FIG. 10 illustrates an exemplary embodiment 1000 in which a micro-LED strip 1050 may be provided. In embodiment 1000, a wafer 1005 having a micropixellated structure forming a plurality of micropixel contact areas and associated micro-LEDs may be provided. Wafer 1005 may include an epitaxial layered structure, such as epitaxial layered structures 500, 500, 504, 506, or 508, having a micropixellated structure 1015 which may be the same as micropixellated structures 590, 592, 594, 596, or 598. Micropixellated structure 1015 may include a pattern of micro-LEDs. As illustrated by the blow-out of micropixellated structure 1015, the micro-LEDs, and associated micropixel contact areas, may be formed in a lined pattern. To form micro-LED strip 1050 wafer 1005 may be cut or sliced. More than one micro-LED strip 1050 may be sliced or cut from wafer 1005. Wafer 1005 may be sliced perpendicular to the lines of micro-LEDs. In other embodiments, wafer 1005 may be sliced to form micro-LED strips 1050 having a desired amount and arrangement of micro-LEDs.

Figure 11:
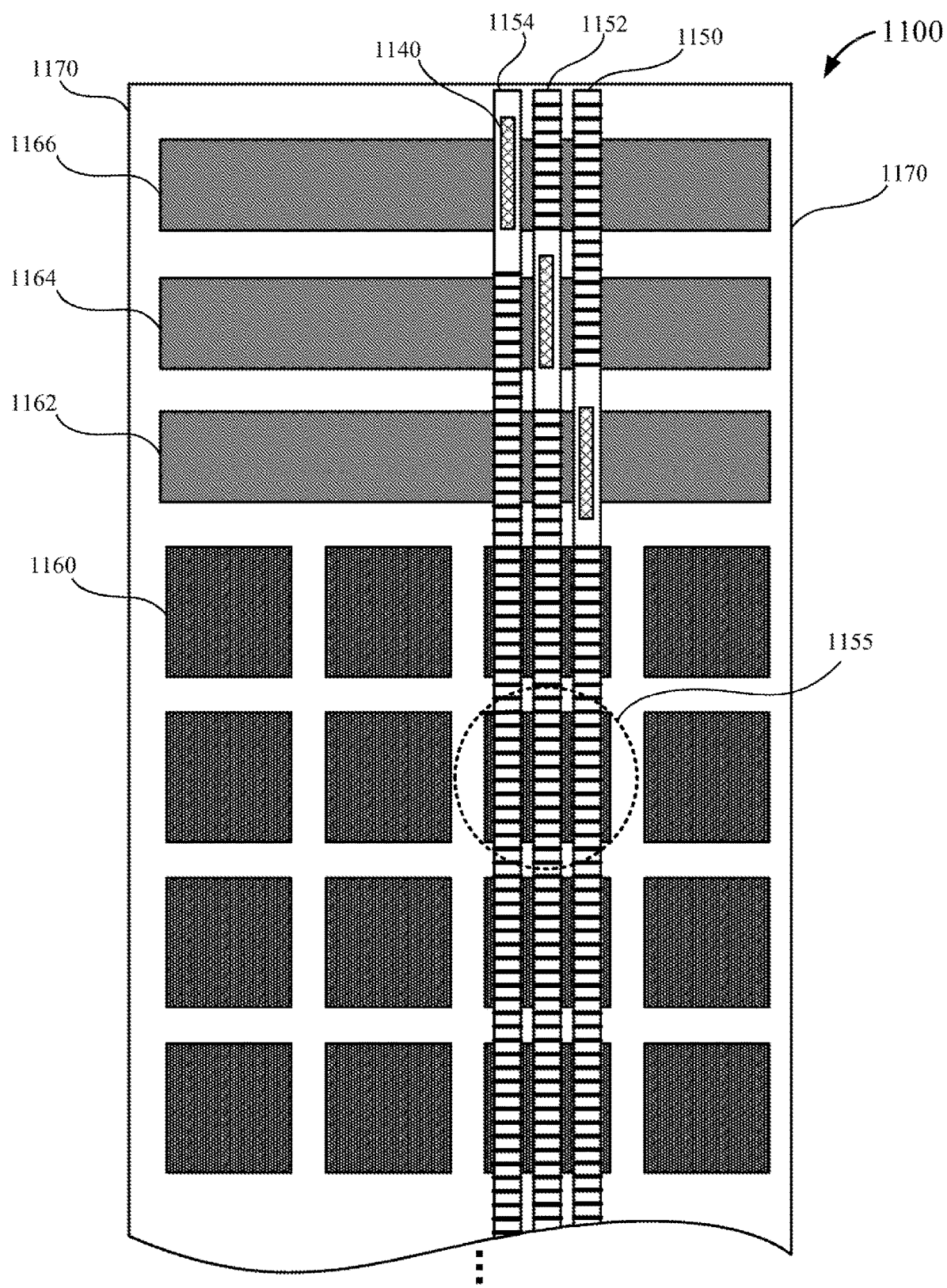
FIG. 11 illustrates a plurality of micro-LED strips forming a RBG display according to certain embodiments.

Once sliced from wafer 1005, micro-LED strip 1050 may include individually addressable micro-LEDs that may be activated (i.e., activated) when bonded onto suitable contacts on a back component (i.e., backplane or driver). In some embodiments, one or more micro-LED strips 1050 may be utilized to form a full color Red-Green-Blue (RGB) display. FIG. 11 illustrates embodiment 1100 in which multiple micro-LED strips 1150, 1152, and 1154 may be used to form a RGB display. FIG. 11 illustrates a backplane 1170 on which three micro-LED strips 1150, 1152, and 1154 overlay. Micro-LED strips 1150, 1152, and 1154 may be the same micro-LED strip 1050 comprising a plurality of micro-LEDs having a micropixellated structure. Backplane 1170 may include multiple contact pads 1160, which may be the same as contact pads 760 or 860. As illustrated, micro-LED strips 1150, 1152, and 1154 may be oriented such to overlay at least one common contact pad 1160, indicated by callout 1155. Although callout 1155 only indicates one contact pad 1160, micro-LED strips 1150, 1152, and 1154 may also overlay additional contact pads 1160, as illustrated in FIG. 11. In some embodiments, contact pads 1160 may each be a common anode for micro-LED strips 1150, 1152, and 1154, activating micro-LEDs on each micro-LED strip which overlay, and are in electrical contact with, contact pads 1160.

As illustrated, each of micro-LED strips 1150, 1152, and 1154 may have a common contact area 1140. Common contact area 1140 may be a common contact for all of the micro-LEDs on each given strip. To form common contact area 1140, during the fabrication process of micro-LED strips 1150, 1152, and 1154 a deep etch may be formed down to the wafer level. Common contact area 1140 may be in contact with an n-type layer, such as semiconductor layer 520, such that when a current is applied to the micro-LEDs on a given micro-LED strip the current flows form the micropixel contact areas of the micro-LEDs, through the micro-LEDs and to common contact area 1140. In some embodiments, common contact area 1140 may be the same as contact layer 480 or contact layer 485.

Each of micro-LED strips 1150, 1152, and 1154 may emit different colored light, in part, due to different material compositions between each micro-LED strip. For example, micro-LED strip 1150 may emit red, micro-LED strip 1152 may emit green, and micro-LED strip 1154 may emit blue. To form micro-LED strips 1150, 1152, and 1154 separate wafers having forming a plurality of micro-LEDs may be fabricated using various materials to achieve the desired light emission color. Then each of these wafers may be sliced into micro-LED strips and reassembled onto a temporary carrier by (i.e., a pick up and place process) to form a temporary wafer of separated RGB strips (i.e., micro-LED strips 1150, 1152, and 1154). The temporary wafer may be diced and bonded to a driver chip, or bonded at the wafer level and then diced.

Each of common contact area 1140 on micro-LED strips 1150, 1152, and 1154 may be size and spaced to overlap with a corresponding contact pad. For example, common contact 1140 on micro-LED strip 1150 may be sized and spaced on micro-LED strip 1150 such to overlay, and be in contact with, contact pad 1162. Common contact 1140 on micro-LED strip 1152 may be sized and spaced on micro-LED strip 1152 to overlay, and be in contact with, contact pad 1164. Common contact 1140 on micro-LED strip 1154 may be sized and spaced on micro-LED strip 1154 to overlay, and be in contact with, contact pad 1166. Common contacts 1140 on each of the micro-LED strips 1150, 1152, and 1154 may be spaced such that only one common contact 1140 overlays each of contact pads 1162, 1164, and 1166. In some embodiments, the size and spacing of common contacts 1140 on each of the strips may be oversized and/or over spaced so that alignment of common contacts 1140 with the corresponding contact pad 1162, 1164, and 1166 may be relaxed. Moreover, the common contacts 1140 may be size and spaced such that a single common contact 1140 does not overlap more than one of contact pads 1162, 1164, and 1166.

Contact pads 1162, 1164, and 1166 may include a contact layer. In some embodiments, contact pads 1162, 1164, and 1166 may be a common electrode for the micro-LEDs on micro-LED strips 1152, 1154, and 1156. In some embodiments, contact pads 1162, 1164, and 1166 may be a common cathode, while in other embodiments, contact pads 1162, 1164, and 1166 may be a common anode. Although FIG. 11 illustrates contact pads 1162, 1164, and 1166 as having similar dimensions to contact pads 1160, in various embodiments, contact pads 1162, 1164, and 1166 may be substantially larger and more widely spaced than contact pads 1160. This may allow for greater alignment tolerances of common contacts 1140 with each of contact pads 1162, 1164, and 1166 during assembly.

The arrangement of micro-LED strips 1150, 1152, and 1154 may allow for isolation of separate red, green, and blue micro-LEDs. This may allow for a sequential color type display. For example, in an embodiment, micro-LED strip 1150 may include blue micro-LEDs, micro-LED strip 1152 may include red micro-LEDs, and micro-LED strip 1154 may include green micro-LEDs. To activate the blue micro-LEDs on micro-LED strip 1150, common contact 1162 may activate at a required voltage, causing blue light to be emitted from the blue micro-LEDs on micro-LED strip 1150 overlaying a contact pad 1160. Similarly, to activate the red micro-LEDs on micro-LED strip 1152, common contact 1164 may activate at a required voltage, causing red light to be emitted from the red micro-LEDs on micro-LED strip 1152 overlying contact pad 1160. And finally, to activate green micro-LEDs on micro-LED strip 1154, common contact 1166 may be activated at a required voltage, causing green light to be emitted from the green micro-LEDs on micro-LED strip 1154 overlying contact pad 1160. In this way, subpixels of each color may be addressed individually and a full color display may be created by sequentially displaying each color in rapid succession. In some embodiments, there may be more than three micro-LED strips 1150, 1152, and 1154. The amount and arrangement of micro-LED strips may vary with application. Any number of micro-LED strips may be feasible.

To form the above described micropixellated structure having a plurality of micropixel contact areas and corresponding micro-LEDs which allow for relaxed or alignment-free assembly, the following methods and embodiments are provided. The general micropixellation process flow for forming an array of micro-LEDs having a micropixellated structure is illustrated in FIGS. 12A-12E. FIGS. 12A-12E illustrate a process flow 1200 on a wafer scale. Process flow 1200 may include various steps. The exact details of each step may vary slightly and in some embodiments, entire steps may be omitted from process flow 1200. In some embodiments, additional step may be included in process flow 1200, however, for ease of discussion these steps may be omitted from the below discussion. To facilitate the discussion of process flow 1200, reference may be made to FIGS. 5A-5E.

Figures 12A, 12B:
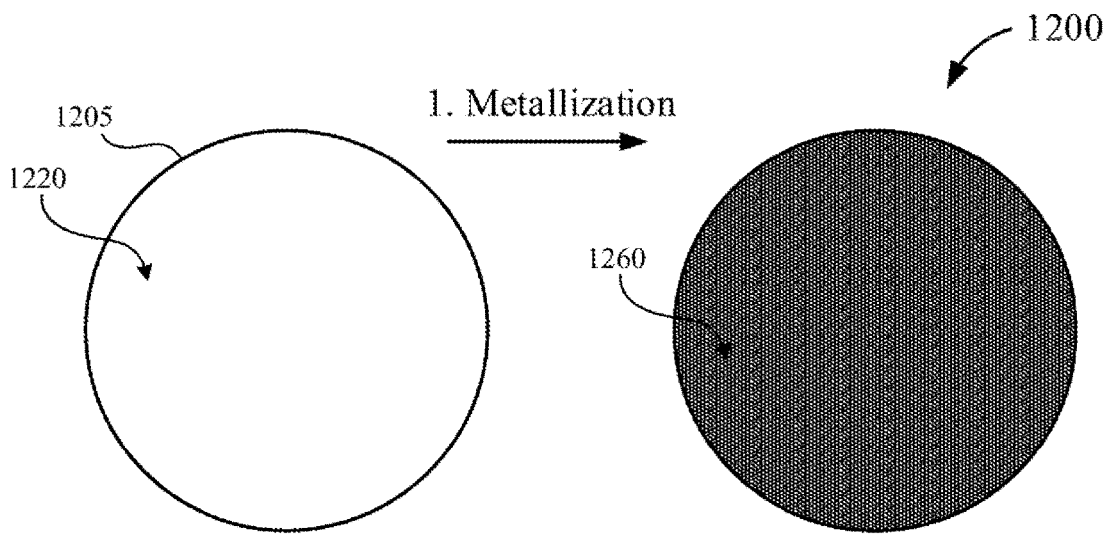
FIGS. 12A-12F provide a simplified process flow diagram of a fabrication process for making a micropixellated structure according to certain embodiments.

At FIG. 12A a wafer 1205 may be provided. In some embodiments, wafer 1205 may be a complete wafer, while in other embodiments, wafer 1205 may be a small section of a wafer or a portion of a surface of a wafer. In some cases, wafer 1205 may be a wafer, or section thereof, on which an epitaxial layered structure was grown onto a substrate that has been flipped, bonded to a carrier, and had the original substrate removed (i.e., by laser lift off or wet etching processes). Wafer 1205 may include a top surface 1220. In some embodiments, top surface 1220 may include one or more epitaxial layers grown on a substrate. The epitaxial layers may include one or more of an upper semiconductor layer, a lower semiconductor layer, and one or more active layers situated between the upper semiconductor layer and the lower semiconductor layer. In some embodiments, the upper semiconductor layer may be the same as semiconductor layer 540, the lower semiconductor layer may be the same as semiconductor layer 520, and the one or more active layers may be the same as active layers 530. In preferred embodiments, top surface 1220 may be an upper semiconductor layer, such as a p-type doped semiconductor layer. At FIG. 12A, one or more of the layers of the epitaxial layers may not be etched and may be in a state as grown. In other embodiments, one or more of the layers of the epitaxial layers may have been etched or subjected to a cleaning or other pretreatment to prepare for process flow 1200.

At FIG. 12B, top surface 1220 of wafer 1205 may be coated with a conductive layer 1260. Conductive layer 1260 may be any material, such as a metal, that is suitable for good ohmic contact with top surface 1220. For example, in some embodiments, conductive layer 1260 may be the same as conductive layer 560. In some embodiments, conductive layer 1260 may be a non-metallic material, such as a transparent conductive oxide (ITO, AZO). In some cases, additional semiconductor materials may be deposited during this stage to form a tunnel junction with top surface 1220 of the epitaxial layers. The thickness of conductive layer 1260 may vary depending on application and in some embodiments, multiple materials may be deposited to perform a dual function of electrical contact and top reflector.

Conductive layer 1260 may be deposited onto top surface 1220 using various techniques. For example, conductive layer 1260 may be deposited by evaporation, sputtering, electroplating, or a combination of these. Conductive layer 1260 may be deposited adjacent to and such to allow ohmic contact between conductive layer 1260 and top surface 1220.

Figures 12C, 12D:
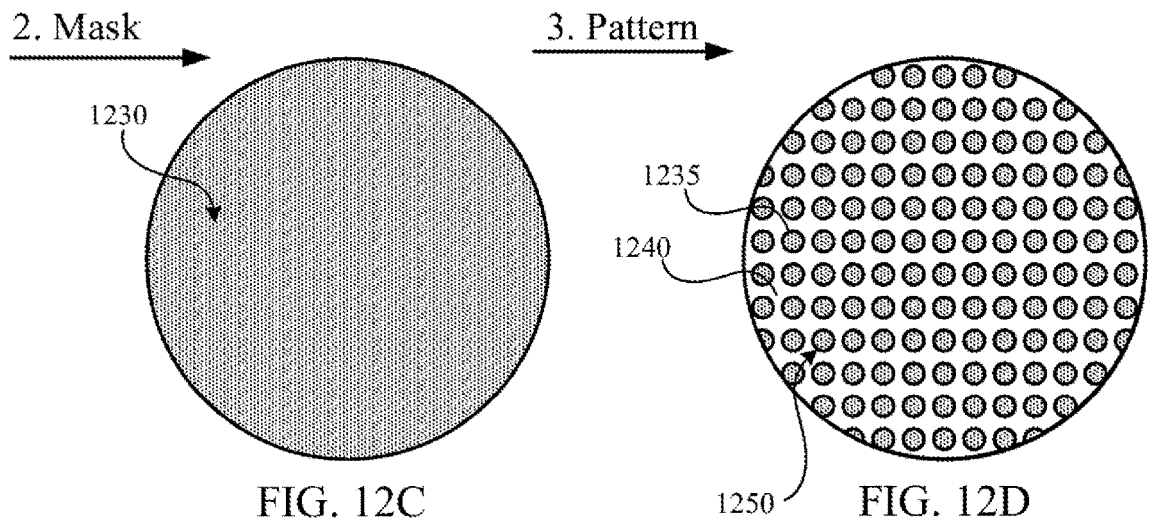

At FIG. 12C a mask layer 1230 may be deposited onto conductive layer 1260. Mask layer 1230 may include a light sensitive material, such as a photoresist. In some embodiments, mask layer 1230 may include multiple layers of a masking material, such as in the case of a hard mask material, mask layer 1230 may include a hard mask material (i.e., $SiO_2$ or $Si_3N_4$) with a photoresist material subsequently deposited onto the hard mask material. Depending on the application and subsequent steps within process flow 1200, in some embodiments, mask layer 1230 may include a material that is sensitive to an electron beam.

In some embodiments, wafer 1205 may undergo a pretreatment before application of mask layer 1230. For example, wafer 1205 may undergo a high temperature process, such as thermal oxidation, immediately before application of mask layer 1230. After a pretreatment, if applicable, a thin, uniform coating of mask layer 1230 may be applied at a specific, well controlled thickness by, for example, a spin coating process. In some embodiments, mask layer 1230 may undergo a post-application bake process to stabilize mask layer 1230. For example, a bake process may remove excess solvent present in mask layer 1230, promote adhesion, and improve the exposure and development properties of mask layer 1230.

After mask layer 1230 is applied to wafer 1205, in some cases onto conductive layer 1260, mask layer 1230 may be exposed and developed to form a patterned mask layer 1235. At FIG. 12D, mask layer 1230 may be exposed and developed to form patterned mask layer 1235. Formation of patterned mask layer 1235 may be done by various processes, such as for example, photolithography processes or scanning electron beam processes. At the process step illustrated in FIG. 12D, mask layer 1230 may be exposed to a light, such as UV or a scanning electron beam, to form patterned mask layer 1235. The effect of exposure to light on mask layer 1230 may vary depending on the type of mask material used for mask layer 1230. For example, when mask layer 1230 includes a positive resist material, the portion of mask layer 1230 exposed to the light may undergo chemical structural changes. These changes to the exposed mask layer 1230 may cause the exposed mask layer 1230 to become soluble during a development step. Thus, in a subsequent development steps, the exposed mask layer 1230 may be washed away, leaving unprotected mask regions 1240. The effect to exposed mask layer 1230 may be the opposite in other processes. For example, in cases where mask layer 1230 includes a negative resist material, exposure to light may cause the exposed mask layer 1230 to become polymerized and/or more difficult to dissolve during subsequent development steps. When mask layer 1230 includes a negative resist material, after exposure the exposed mask layer 1230 may remain on wafer 1205 wherever it was exposed, and the unexposed regions of mask layer 1230 may be removed during development to form unprotected mask regions 1240.

Patterned mask layer 1235 may correspond to the overall size, shape, and spacing of the resulting micro-LEDs. For example, patterned mask layer 1235 may correspond to a fine pitch array of micro-LEDs formed on wafer 1205. In some embodiments, patterned mask layer 1235 may set the pitch and size of the micro-LEDs of the finished device. It may be desirable that the pitch and size of the micro-LEDs be slightly smaller than the size and pitch of the micro-LEDs of the finished device. For example, for a 5 µm square of micro-LEDs on a 6 µm pitch, a 2-dimensional regular array of 0.5 µm diameter pixels on a 1 µm pitch may be patterned onto wafer 1205 via patterned mask layer 1235. Patterned mask layer 1235 may also correspond to the pattern of micro-LEDs 1250 formed within a micro-LED array, such as in a closely-packed hexagonal shape or a square shape. Other patterns may be appropriate depending on the application. Other sizes of micro-LEDs and pitches may also be appropriate depending on the final pixel sizes.

In embodiments where mask layer 1230 includes a hard mask having multiple layers of different materials, then only one layer of the hard mask may be etched to form patterned mask layer 1235. The remaining layers of mask layer 1230 may stay, coating top surface 1220 and/or conductive layer 1260, depending on the embodiment. In some cases, the remaining layers of mask layer 1230 may be removed during subsequent steps in process flow 1200.

Patterned mask layer 1235 may protect at least part of underlying conductive layer 1260 and may expose one or more unprotected mask regions 1240. In some embodiments, at least part of underlying conductive layer 1260 may be exposed as part of unprotected mask region 1240. In such cases, unprotected conductive layer 1260 may be removed during subsequent processing of unprotected mask regions 1240. In some cases, a portion of conductive layer 1260 may be removed during the exposure and development processes. This may result in conductive layer 1260 forming a similar or opposite pattern to patterned mask layer 1235. In some embodiments, the formed pattern of conductive layer 1260 may correspond to the pattern of micropixel contact areas resulting from process flow 1200.

In some embodiments, process flow 1200 may end after exposure and development of mask layer 1230 to formed mask layer 1235. For example, in cases where a micropixellated structure such as micropixellated structure 598 illustrated in FIG. 5E is desirable, then process flow 1200 may end here. In such an embodiment, during exposure and development of mask layer 1230, portions of conductive layer 1260 may be removed, leaving a pattern of conductive layer 1260. The pattern of conductive layer may correspond to the conductive layer that is part of the micropixellated structure, such as conductive layer 560. Moreover, the patterned conductive layer 1260 may correspond to a plurality of micropixel contact areas. In some embodiments, the remaining mask material that is part of the patterned mask layer 1235 may be removed before fabrication of the resulting micro-LED device. In other embodiments, the patterned mask layer 1235 may not be removed.

Figures 12E, 12F:
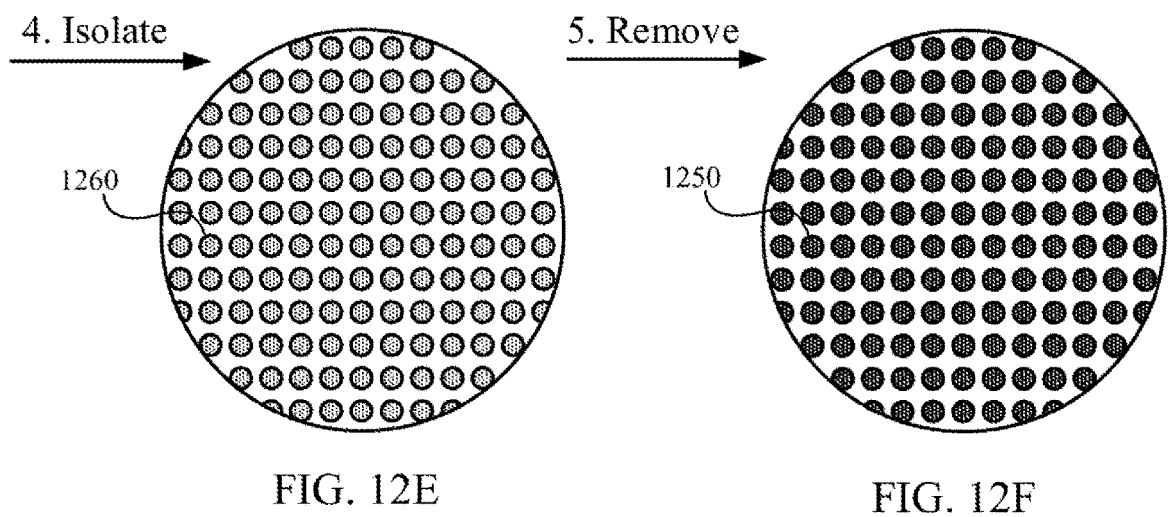

In embodiments, after patterned mask layer 1235 is formed, then at FIG. 12E, one or more of unprotected mask regions 1240 may be processed to form a micropixellated structure having isolated micropixel regions. Exemplary micropixellated structures that may be formed at FIG. 12E may include micropixellated structures 590, 592, 594, and 596. The micropixellated structures formed at this step may include a plurality of micropixel regions that are electrically isolated from one another. Various processes may be used to form the micropixellated structures, depending on the desired application and isolation structure of the micropixel regions.

In some embodiments, an etch process, such as dry etching in an inductively coupled plasma (ICP) etch or reactive-ion etching (RIE) system, may be used to etch through unprotected mask regions 1240. The etch may continue through conductive layer 1260 and through one or more layers of the underlying epitaxial layers. For example, the etch may continue through an upper semiconductor layer, through one or more active layers, and to a lower semiconductor layer. The etch may stop somewhere within the lower semiconductor layer, although in some application the etch may continue through the entirety of the lower semiconductor layer and stop at the substrate. In some embodiments, the etch process described herein may result in an epitaxial layered structure such as epitaxial layered structure 500 having a micropixellated structure, such as micropixellated structure 590. In such embodiments, the etch process may remove portions of semiconductor layer 540 (i.e., the upper semiconductor layer), active layers 530, and a portion of semiconductor layer 520 (i.e., the lower semiconductor layer), resulting in a plurality of micropixel regions, such as micropixel regions 570, that are electrically isolated from one another. Each of the micropixel regions formed during the etch process may include semiconductor layer 540, active layers 530, and a portion of semiconductor layer 520. In various embodiments, however, the micropixel regions formed during the etch process may vary and include different epitaxial layers and/or amounts of each layer.

In another embodiment, processing of unprotected mask regions 1240 may include converting a portion of the upper semiconductor layer to have modified conductive properties. In one embodiment, modifying an upper layer of the upper semiconductor layer to have modified conductive properties may include subjecting wafer 1205 having patterned mask layer 1235 thereon to a plasma treatment process. Exemplary plasma treatments may include those described in U.S. Pat. No. 10,211,371 which is hereby incorporated in its entirety by reference. During a plasma treatment process, plasma may be used to convert an upper layer of the upper semiconductor layer into a non-conducting semiconductor species. For example, the upper layer of the upper semiconductor layer may be the same as upper layer 542 described with respect to micropixellated structure 592 in FIG. 5B. The converted upper layer of the upper semiconductor layer may form a plurality of micropixel regions, such as micropixel regions 572, that are electrically isolated from one another. In some embodiments, the plasma treatment process may be followed by an annealing process. During an annealing process, the upper lay being converted may completely convert to a non-conducting state. In some embodiments, this annealing step may also be the step that causes conductive layer 1260 to form an ohmic contact with the upper layer material 1220.

In another embodiment, processing of unprotected mask regions 1240 may include an ion implantation process. During an ion implantation process, energetic ions may bombard the unprotected mask regions 1240 to convert an upper layer of the upper semiconductor layer to have modified conductive properties. The species of ions may vary depending on the desired modification to the upper layer. For example, ions of hydrogen, oxygen, nickel, boron, silicon, or any other ion may be used. Sufficient energy may be required to ensure implantation of the energetic ion into the upper layer of the upper semiconductor layer. To assist with precise implantation, in some embodiments, a dielectric layer (i.e., $Si_3N_4$) of sufficient thickness may be deposited over any of the upper semiconductor layer that may have been exposed during the exposure and development step. The ion implantation process may form a micropixellated structure such as micropixellated structure 594. The upper layer of the upper semiconductor layer that is converted to have modified conductive properties during the ion implantation process may be the same as upper layer 544. The converted upper layer may form a plurality of micropixel regions that are electrically isolated from one another, such as micropixel regions 574.

In still other embodiments, processing of unprotected mask regions 1240 may include an ion diffusion process. Processing unprotected mask regions 1240 via ion diffusion may form a micropixellated structure such as micropixellated structure 596 depicted in FIG. 5D. Ion diffusion processes may vary from ion implantation processes in that ion diffusion may be isotropic and allow for lateral diffusion of the ions. By allowing lateral diffusion of ions, upper layer of the upper semiconductor layer underneath conductive layer 1260 may be modified. For example, upper layers modified by ion diffusion may be the same as upper layer 546 depicted in FIG. 5D. As illustrated by FIG. 5D, a portion of upper layer 546 of semiconductor layer 540 that is directly under conductive layer 560 may be converted as well as upper layer 546 that is not directly under conductive layer 560. The ion diffusion process may form a plurality of micropixel regions, such as micropixel regions 576, that are electrically isolated from one another. In some embodiments, the ion diffusion process may include deposition of a solid material on the unprotected mask regions 1240, followed by a heat treatment. In other embodiments, ion diffusion may utilize a gaseous material to convert the upper layer of the upper semiconductor layer to have modified conductive properties.

In some embodiments, processing the unprotected mask regions 1240 may include removing portions of conductive layer 1260 to form a plurality of micropixel contact areas. By removing portions of conductive layer 1260, the plurality of micropixel contact areas may be electrically isolated from one another. In some embodiments, removal of portions of the conductive layer 1260 to form the plurality of micropixel contact areas may occur during the exposure and development step of process flow 1200.

In some embodiments, process flow 1200 may include a removal step as illustrated in FIG. 12F. During the removal step, any remaining mask material part of patterned mask layer 1235 may be removed. For example, any remaining photoresist, hard dielectric mask or layers may be removed. After patterned mask layer 1235 and/or any remaining mask layer 1230 is removed, a plurality of micropixel contact areas that are electrically isolated from one another may be left on the top surface 1220. In some embodiments, the micropixel contact areas may be a fine-pitch pattern of conductive layer 1260. In some embodiments, process flow 1200 may include an annealing step either before or after removing pattern mask layer 1235. During the annealing step, conductive layer 1260 may be converted to be an ohmic contact for the upper semiconductor layer.

A second contact area may be formed over the entire wafer at this stage. In some embodiments, this may require initial removal of the substrate. The second contact area may be metallic and may be a coarse or fine grid of contacts permitting light to exit between the contacts. In other embodiments, the second contact area may comprise a transparent conductive oxide. In some cases, the second contact area may be formed after dicing and bonding of the microLEDs to the driver backplane. While in still other cases, the second contact area may be formed by etching through the upper layers of the microLED (e.g., upper semiconductor layer 540 and active layers 530) and depositing a common electrode to the lower semiconductor layer (e.g., semiconductor layer 520) to the edges of each microLED array.

The final product produced by process flow 1200 may be semiconductor wafer 1205 or section of wafer 1205 covered on top surface 1220 with a plurality of micropixel contact areas that are electrically isolated from one another. For example, a test for continuity between two adjacent micropixel contact areas may demonstrate high resistance (e.g., greater than $10^8$ Ohm) at voltages below the bandgap of the semiconductor p-n junction (i.e., the boundary or interface between the upper semiconductor layer and the lower semiconductor layer; often the one or more active layers). At higher voltages, a conductive path may be formed via the continuous untreated, lower semiconductor layer, often underlying the active layers. The current flow may be accompanied by light emission.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An apparatus for providing conductivity comprising:
an epitaxial layered structure comprising:
- a first-type doped semiconductor layer;
- a second-type doped semiconductor layer; and
- an active layer between the first-type doped semiconductor layer and the second-type doped semiconductor layer;

a conductive layer adjacent to and in ohmic contact with the first-type doped semiconductor layer, the conductive layer having a micropixellated structure comprising a plurality of micropixel contact areas that are electrically isolated from each other, each micropixel contact area corresponding to an individual micro light emitting diode (micro-LED);

a first contact pad; and
a second contact pad, wherein:
the plurality of micropixel contact areas are sized and spaced to allow the plurality of micropixel contact areas to overlap the first contact pad for providing charge flow for a pixel in an array of pixels formed using the epitaxial layered structure,
the first contact pad is a first-type electrode shared by micro-LEDs corresponding to the plurality of micropixel contact areas, the first-type electrode being an anode or a cathode, and
the second contact pad is a second-type electrode shared by the micro-LEDs corresponding to the plurality of micropixel contact areas, the second-type electrode being of opposite type to the first-type electrode.

2. The apparatus of claim 1, wherein the first-type doped semiconductor layer comprises a p-type doped semiconductor layer, and the second-type doped semiconductor layer comprises an n-type doped semiconductor layer.

3. The apparatus of claim 1, wherein the micropixellated structure comprises a closely-packed hexagonal pattern of the plurality of micropixel contact areas.

4. The apparatus of claim 1, wherein the micropixellated structure comprises a square pattern of the plurality of micropixel contact areas.

5. The apparatus of claim 1, wherein the micropixellated structure further comprises a plurality of micropixel regions in the first-type doped semiconductor layer.

6. The apparatus of claim 5, wherein the plurality of micropixel regions are isolated from one another by a physical etch.

7. The apparatus of claim 5, wherein the plurality of micropixel regions are electrically isolated from one another by an upper layer of first-type doped semiconductor layer, within the first-type doped semiconductor layer, having reduced conductivity.

8. The apparatus of claim 7, wherein the upper layer of first-type doped semiconductor layer having reduced conductivity is formed by plasma treatment.

9. The apparatus of claim 7, wherein the upper layer of first-type doped semiconductor layer having reduced conductivity is formed by ion implantation.

10. The apparatus of claim 7, wherein the upper layer of first-type doped semiconductor layer having reduced conductivity is formed by ion diffusion.

11. The apparatus of claim 1, wherein the apparatus further comprises a light extraction feature, and wherein the light extraction feature is positioned to collate light emitted from a plurality of micropixels corresponding to the plurality of micropixel contact areas.

12. The apparatus of claim 1, wherein the micropixellated structure forms a strip comprising the plurality of micropixel contact areas and a common contact area, the common contact area being in electrical contact with the second contact pad.

13. The apparatus of claim 12, further comprising:
a plurality of strips, wherein:
a first strip corresponds to a red color emission and comprises a first common contact in a first position;
a second strip corresponds to a blue color emission and comprises a second common contact in a second position;
a third strip corresponds to a green color emission and comprises a third common contact in a third position; and
wherein each of the first common contact, the second common contact, and the third common contact are sized and spaced to allow overlap with a respective contact pad for providing charge flow for a pixel in an array of pixels formed using the plurality of strips.

14. The apparatus of claim 12, wherein the common contact area is non-overlapping with the plurality of micropixel contact areas.

* * * * *